(12) United States Patent
Kim et al.

(10) Patent No.: US 11,470,729 B2
(45) Date of Patent: Oct. 11, 2022

(54) ELECTRONIC DEVICE INCLUDING FLEXIBLE DISPLAY AND ANTENNA

(71) Applicant: Samsung Electronics Co., Ltd., Suwon-si (KR)

(72) Inventors: Yongyoun Kim, Suwon-si (KR); Kyungmoon Seol, Suwon-si (KR); Minsung Lee, Suwon-si (KR); Jinwoo Jung, Suwon-si (KR); Soyoung Lee, Suwon-si (KR); Jaebong Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/056,242

(22) PCT Filed: May 14, 2019

(86) PCT No.: PCT/KR2019/005771
§ 371 (c)(1),
(2) Date: Nov. 17, 2020

(87) PCT Pub. No.: WO2019/245165
PCT Pub. Date: Dec. 26, 2019

(65) Prior Publication Data
US 2021/0219437 A1    Jul. 15, 2021

(30) Foreign Application Priority Data

Jun. 19, 2018  (KR) .................. 10-2018-0070470

(51) Int. Cl.
*H05K 5/00*  (2006.01)
*H05K 5/02*  (2006.01)
(Continued)

(52) U.S. Cl.
CPC ......... *H05K 5/0017* (2013.01); *H05K 5/0217* (2013.01); *H05K 7/1427* (2013.01); *H04B 1/3827* (2013.01)

(58) Field of Classification Search
USPC ........................................ 361/728, 752, 798
See application file for complete search history.

(56) References Cited

U.S. PATENT DOCUMENTS 8,219,164 B2    7/2012  Cho et al.
10,209,742 B2   2/2019  Shin
(Continued)

FOREIGN PATENT DOCUMENTS

CN         105718134 A      6/2016
KR   10-2007-0112517 A      11/2007
(Continued)

OTHER PUBLICATIONS

European Search Report dated Jul. 6, 2021, issued in European Application No. 19821950.3.
(Continued)

*Primary Examiner* — Hung S. Bui
(74) *Attorney, Agent, or Firm* — Jefferson IP Law, LLP

(57) ABSTRACT

Various embodiments of the present invention relate to an electronic device which employs a flexible display and, even when a housing is changed in size or shape, can keep an antenna at the same characteristic. The electronic device may comprise: a first side surface member, on one surface of which a plurality of conductive parts and at least one first non-conductive part disposed between the plurality of conductive parts are arranged; a second side surface member movable toward the one side of the first side surface member; a flexible display, the width of the exposed portion of which can be adjusted on the basis of the movement of the second side surface member; and a wireless communication
(Continued)

circuit electrically connected to at least one of the plurality of conductive parts and configured to transmit or receive an RF signal, wherein the second side surface member comprises a sliding cover surface disposed to face the one surface of the first side surface member, and the sliding cover surface has at least one second non-conductive part formed on a portion thereof facing the first non-conductive part, when the overlap between the second side surface member and the first side surface member is largest, and the sliding cover surface is formed not to face the first non-conductive part when the overlap between the second side surface member and the first side surface member is smallest or there is no overlap therebetween. Various other embodiments of the present invention may be additionally provided.

19 Claims, 31 Drawing Sheets

(51) Int. Cl.
  *H05K 7/14* (2006.01)
  *H04B 1/3827* (2015.01)

(56) References Cited

U.S. PATENT DOCUMENTS

| | | | |
|---|---|---|---|
| 10,254,863 B2 | 4/2019 | Shin et al. | |
| 11,029,733 B2 * | 6/2021 | Lee | G06F 1/1652 |
| 11,112,826 B2 * | 9/2021 | Ko | G06F 3/04817 |
| 11,243,634 B2 * | 2/2022 | Ko | G06F 3/0416 |
| 2011/0001715 A1 | 1/2011 | Cha et al. | |
| 2013/0058063 A1 | 3/2013 | O'Brien | |
| 2017/0141820 A1 | 5/2017 | Kim et al. | |
| 2017/0346164 A1 | 11/2017 | Kim et al. | |
| 2017/0364119 A1 | 12/2017 | Lee et al. | |
| 2018/0102072 A1 * | 4/2018 | Lee | G09F 9/301 |
| 2019/0121396 A1 | 4/2019 | Ha et al. | |

FOREIGN PATENT DOCUMENTS

| | | |
|---|---|---|
| KR | 10-0955818 B1 | 5/2010 |
| KR | 10-2011-0002365 A | 1/2011 |
| KR | 10-2011-0078050 A | 7/2011 |
| KR | 10-2014-0059274 A | 5/2014 |
| KR | 10-2017-0081559 B1 | 7/2017 |
| KR | 10-2017-0133952 A | 12/2017 |
| KR | 10-2017-0141438 A | 12/2017 |
| WO | 2017/061762 A1 | 4/2017 |

OTHER PUBLICATIONS

Kimmo Rasilainen. 'Antenna Performance in Bendable Mobile Devices'. Aalto University School of Electrical Engineering, Nov. 30, 2020.

Korean Office Action dated May 6, 2022, issued in Korean Application No. 10-2018-0070470.

* cited by examiner

ELECTRONIC DEVICE INCLUDING FLEXIBLE DISPLAY AND ANTENNA

TECHNICAL FIELD

Various embodiments of the disclosure relate to an electronic device capable of maintaining antenna performance even when a size or shape of a housing is changed by employing a flexible display.

BACKGROUND ART

With the development of display technology, research and development of electronic devices having flexible displays are being actively conducted. Since flexible displays can be folded, bent, rolled, or unfolded, the flexible displays are expected to greatly contribute to a reduction in the volume of electronic devices or a design change of electronic devices.

Such flexible displays are implemented in the form of an organic electroluminescent display device or a liquid crystal display device. For example, existing liquid crystal display devices and organic electroluminescent display devices may be manufactured by replacing a glass substrate with a flexible plastic film.

DISCLOSURE OF INVENTION

Technical Problem

An electronic device may be implemented in a foldable type in which the electronic device is folded by employing a flexible display, or a sliding type in which at least a portion of the electronic device is increased in size in a sliding method.

However, in an electronic device employing a conventional flexible display, when the structure or shape of a housing is changed, the antenna characteristics of the electronic device may also be changed, and the performance of the antenna may be degraded.

Various embodiments of the disclosure are able to provide an electronic device capable of maintaining the performance of an antenna even if the size or shape of a housing is changed by disposing an external segment on at least a portion of a sliding cover facing an inner segment disposed on a surface of a side member.

Solution to Problem

An electronic device according to various embodiments of the disclosure may include: a housing including a first plate facing a first direction, a second plate facing a second direction opposite the first direction, and a space defined between the first plate and the second plate; a first side member surrounding a portion of the space and having multiple conductive portions disposed on one surface thereof and at least one first non-conductive portion disposed between the multiple conductive portions; a second side member surrounding another portion of the space at one side of the first side member and configured to be movable toward the one side of the first side member; a flexible display exposed through the first plate, an exposed width of the flexible display being adjusted based on the movement of the second side member; and a wireless communication circuit electrically connected to at least one of the multiple conductive portions and configured to transmit or receive RF signals, wherein the second side member may include a sliding cover surface disposed to face the one surface of the first side member, and wherein the sliding cover surface may include at least one second non-conductive portion disposed on a portion facing the first non-conductive portion when the second side member overlaps the first side member most widely, and may not face the first non-conductive portion when the second side member overlaps the first side member most narrowly or does not overlap the first side member.

An electronic device according to various embodiments of the disclosure may include: a housing including a first plate facing a first direction, a second plate facing a second direction opposite the first direction, and a space defined between the first plate and the second plate; a first side member surrounding a portion of the space and having multiple conductive portions disposed on one surface thereof and at least one first non-conductive portion disposed between the multiple conductive portions; a second side member surrounding another portion of the space at one side of the first side member and configured to be movable toward the one side of the first side member; a flexible display exposed through the first plate, an exposed width of the flexible display being adjusted based on the movement of the second side member; and a wireless communication circuit electrically connected to at least one of the multiple conductive portions and configured to transmit or receive RF signals, wherein the second side member may include a sliding cover surface disposed to face the one surface of the first side member, and wherein the sliding cover surface may include a second non-conductive portion disposed on a portion facing the first non-conductive portion when the second side member overlaps the first side member most widely, and a third non-conductive portion disposed on a portion facing the first non-conductive portion when the second side member overlaps the first side member most narrowly.

An electronic device according to various embodiments of the disclosure may include: a housing including a first plate facing a first direction, a second plate facing a second direction opposite the first direction, and a space defined between the first plate and the second plate; a first side member surrounding a portion of the space and including multiple conductive portions disposed on one surface thereof and at least one first non-conductive portion disposed between the multiple conductive portions; a second side member surrounding another portion of the space at one side of the first side member and configured to be movable toward the one side of the first side member; a flexible display exposed through the first plate, an exposed width of the flexible display being adjusted based on the movement of the second side member; and a wireless communication circuit electrically connected to at least one of the multiple conductive portions and configured to transmit or receive RF signals, wherein the second side member may be disposed so as to expose the one surface of the first side member and may include a sliding cover surface located adjacent to a boundary of the one surface in the second direction when viewed from above the one surface, and wherein the sliding cover surface may include at least one second non-conductive portion disposed on a portion arranged in a straight line with the first non-conductive portion when viewed from above the one surface when the second side member overlaps the first side member most widely, and may not be located adjacent to the first non-conductive portion when viewed from above the one surface when the second side member overlaps the first side member most narrowly or does not overlap the first side member.

Advantageous Effects of Invention

According to various embodiments of the disclosure, it is possible for an electronic device to constantly maintain the performance of an antenna even if the size or shape of a housing is changed by disposing an external segment on at least a portion of a sliding cover facing an inner segment disposed on a surface of a side member.

MODE FOR THE INVENTION

Figure 1:
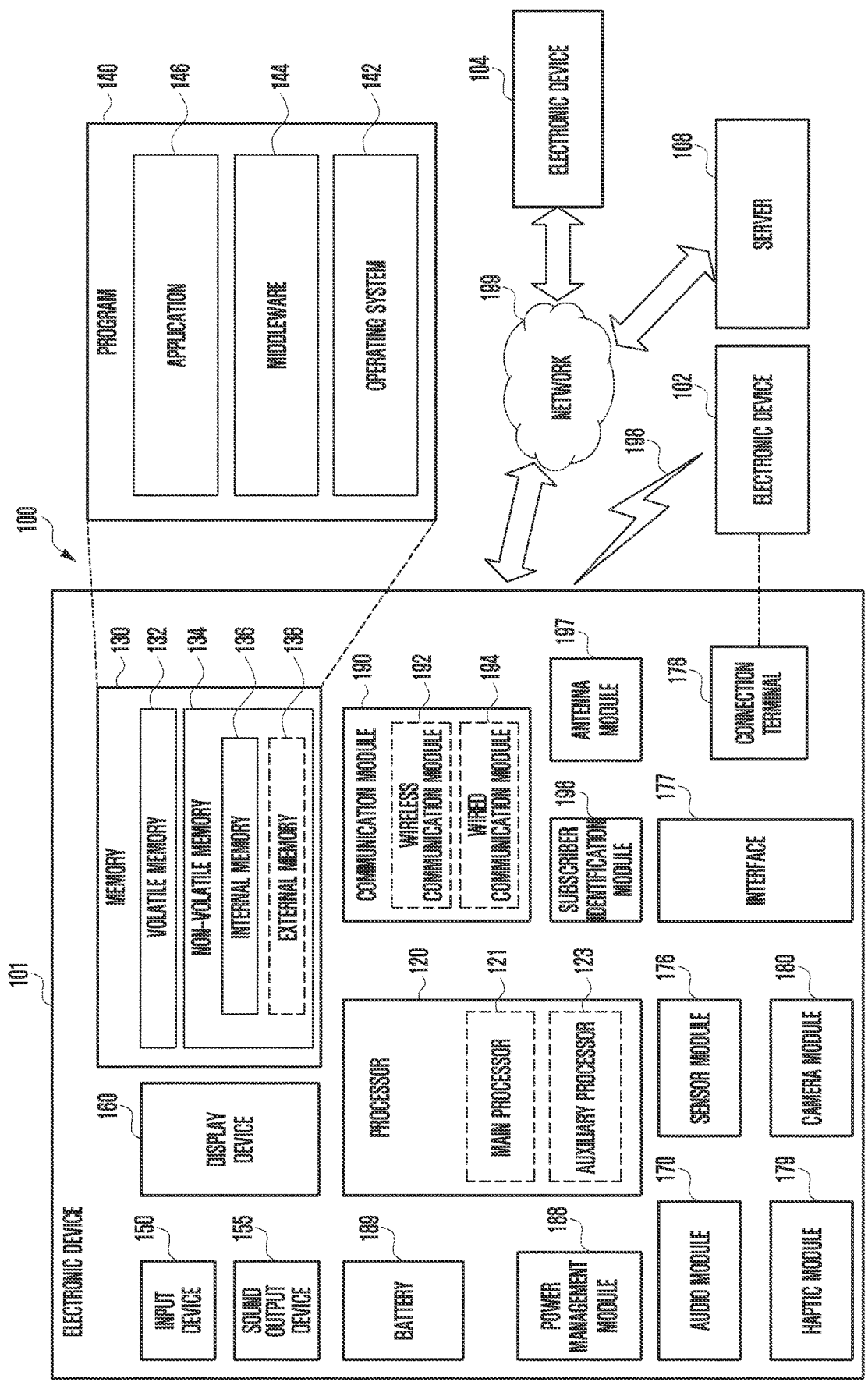
FIG. 1 is a block diagram illustrating an electronic device according to various embodiments in a network environment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 4A:
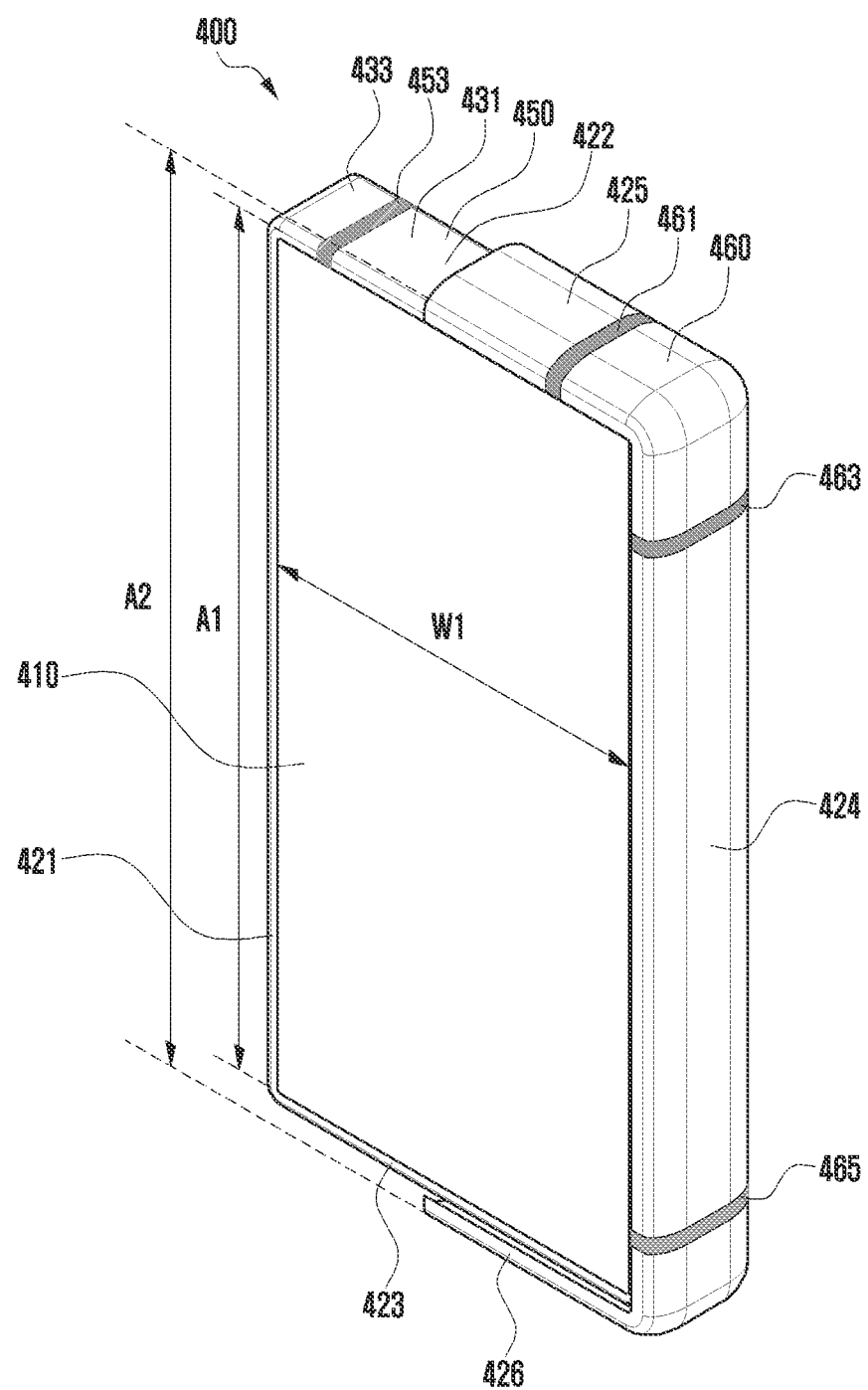
FIGS. 4A and 4B are perspective views illustrating an electronic device according to an embodiment of the disclosure.
Figure 4B:
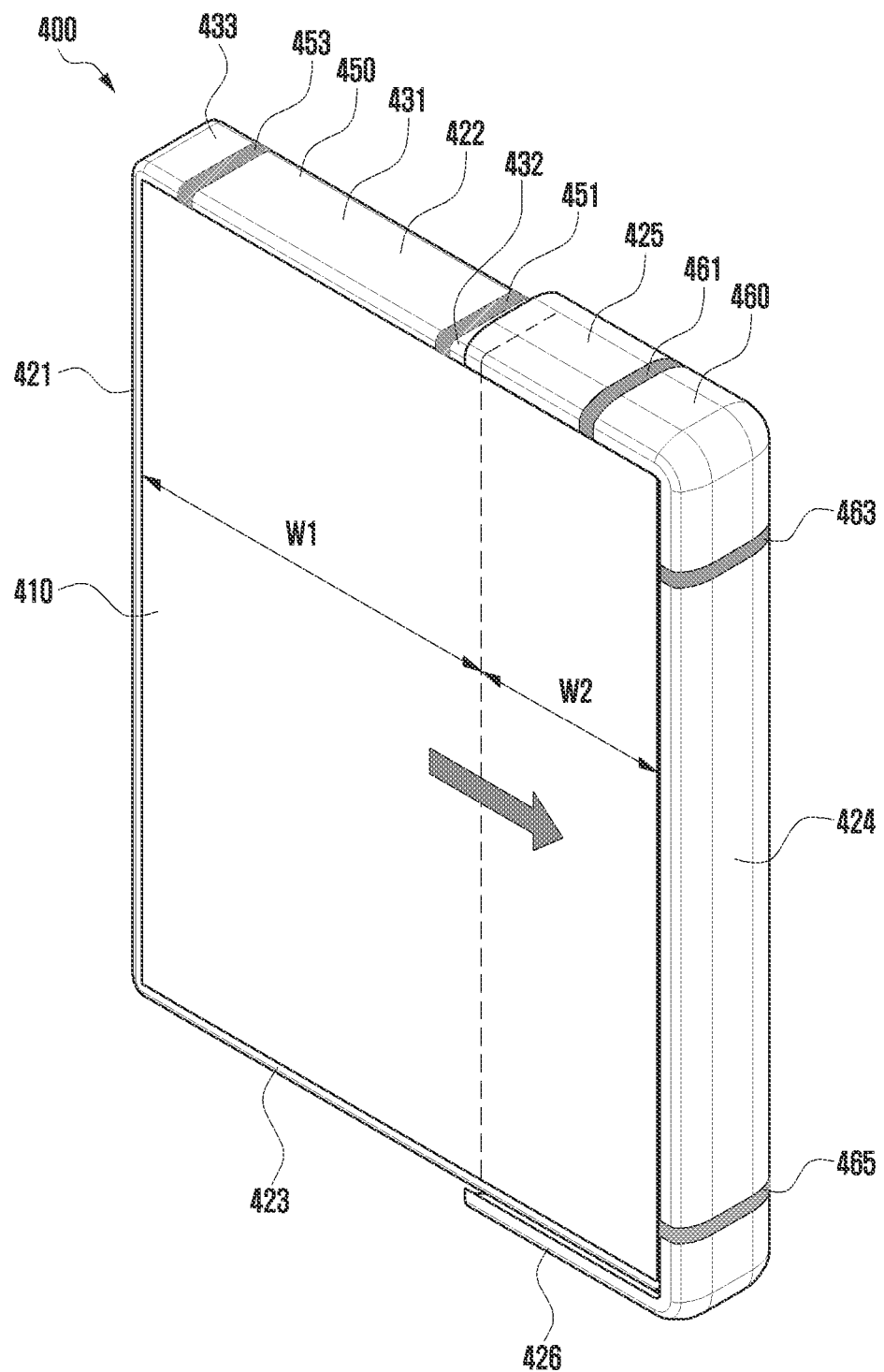

An electronic device (e.g., the electronic device 200 in FIG. 2) according to various embodiments of the disclosure may include: a housing including a first plate (e.g., the first plate 201 in FIG. 2) facing a first direction, a second plate (e.g., the second plate 203 in FIG. 2) facing a second direction opposite the first direction, and a space defined between the first plate 201 and the second plate 203; a first side member (e.g., the first side member 221 in FIG. 2) surrounding a portion of the space and having multiple conductive portions (e.g., the multiple conductive portions 431, 432, and 433 in FIG. 4) disposed on one surface thereof and at least one first non-conductive portion (e.g., the first inner segment 451 or the second inner segment 453 in FIG. 4B) disposed between the multiple conductive portions 431, 432, and 433; a second side member (e.g., the second side member 223 in FIG. 2) surrounding another portion of the space at one side of the first side member 221 and configured to be movable toward the one side of the first side member 221; a flexible display (e.g., the display 210 in FIG. 2) exposed through the first plate 201, an exposed width of the flexible display being adjusted based on the movement of the second side member 223; a wireless communication circuit (e.g., the communication module 190 in FIG. 1) electrically connected to at least one of the multiple conductive portions 431, 432, and 433 and configured to transmit or receive RF signals, wherein the second side member 223 may include a sliding cover surface (e.g., the fifth surface 425 in FIG. 4B) disposed to face the one surface of the first side member 221, and wherein the sliding cover surface 425 may include at least one second non-conductive portion 461 disposed on a portion facing the first non-conductive portion 451 when the second side member 223 overlaps the first side member 221 most widely, and may not face the first non-conductive portion 451 when the second side member 223 overlaps the first side member 221 most narrowly or does not overlap the first side member 221.

The multiple conductive portions 431, 432, and 433 may include a first conductive portion (e.g., the first conductive portion 431 in FIG. 4B), a second conductive portion (e.g., the second conductive portion 432 in FIG. 4B), and a third conductive portion (e.g., the third conductive portion 433 in FIG. 4B), the first conductive portion 431 may be disposed between the second conductive portion 432 and the third conductive portion 433, the at least one first non-conductive portion 451 may include a third non-conductive portion (e.g., the first inner segment 451 in FIG. 4B) disposed between the first conductive portion 431 and the second conductive portion 432 and a fourth non-conductive portion (e.g., the second inner segment 453 in FIG. 4B) disposed between the first conductive portion 431 and the third conductive portion 433, and the third non-conductive portion 451 may overlap the second non-conductive portion 461 while the second side member 223 overlaps the first side member 221 most widely.

The electronic device may further include a processor 120 electrically connected to the flexible display 210 and the wireless communication circuit 190 and a printed circuit board (e.g., the printed circuit board 541 in FIG. 5) on which the processor 120 and the wireless communication circuit 190 are mounted.

The RF signals may include first to third RF signals, the first conductive portion 431 may be disposed to transmit or receive the first RF signal, the second conductive portion 432 may be disposed to transmit or receive the second RF signal, and the third conductive portion 433 may be disposed to transmit or receive the third RF signal.

The first RF signal may be a signal related to a low-frequency band, and the second RF signal and the third RF signal may be signals related to a medium-frequency band or a high-frequency band.

The electronic device may further include a sliding substrate disposed inside the second side member 223 to be movable toward the one side of the first side member 221 and disposed to support a portion of the flexible display 210, a hinge shaft disposed in the length direction of the flexible display 210 and configured to rotate based on the movement of the second side member 223, and an articulated hinge including multiple joints surrounding the hinge shaft and configured to adjust the exposed width of the flexible display 210 by adjusting the length of the portion facing the first direction based on the rotation of the hinge shaft.

The electronic device may further include an insulating member (e.g., the insulating member 1940 in FIG. 20A) disposed on an inner surface of the sliding cover surface 425 facing the one surface of the first side member 221. The insulating member 1940 may be an insulating tape.

The sliding cover surface 425 may further include a fourth conductive portion (e.g., the fourth conductive portion 562 in FIG. 11) located adjacent to the second non-conductive portion 461, and the fourth conductive portion 562 may be connected to a ground of the printed circuit board 541 via the hinge shaft.

The second conductive portion 432 may include, between the first side member 221 and the second side member 223, a first protrusion (e.g., the first protrusion 2401 in FIG. 24), and the fourth conductive portion 562 may include a second protrusion (e.g., the second protrusion 2402 in FIG. 24) configured to come into contact with the first protrusion 2401 so as to form an electrical path when the overlapping portion between the second side member 223 and the first side member 221 is the narrowest.

The electronic device may further include a third side member (e.g., the third side member 325 in FIG. 3) surrounding another portion of the space at the other side of the first side member 221 and configured to be movable toward the other side of the first side member 221, and the third side member 325 may include the same components as the second side member 223 and may be arranged to be symmetrical to the second side member 223.

The exposed width of the flexible display 210 may be adjusted based on the movement of the second side member 223 or the movement of the third side member 325.

An electronic device (e.g., the electronic device 1400 in FIG. 14) according to various embodiments of the disclosure may include: a housing including a first plate (e.g., the first plate 201 in FIG. 2) facing a first direction, a second plate (e.g., the second plate 203 in FIG. 2) facing a second direction opposite the first direction, and a space defined between the first plate 201 and the second plate 203; a first side member (e.g., the first side member 221 in FIG. 2) surrounding a portion of the space and having multiple conductive portions (e.g., the multiple conductive portions 431, 432, and 433 in FIG. 4) disposed on one surface thereof and at least one first non-conductive portion (e.g., the first inner segment 551 in FIG. 14) disposed between the multiple conductive portions 431, 432, and 433; a second side member (e.g., the second side member 223 in FIG. 2) surrounding another portion of the space at one side of the first side member 221 and configured to be movable toward the one side of the first side member 221; a flexible display (e.g., the display 210 in FIG. 2) exposed through the first plate 201, an exposed width of the flexible display being adjusted based on the movement of the second side member 223; a wireless communication circuit (e.g., the communication module 190 in FIG. 1) electrically connected to at least one of the multiple conductive portions 431, 432, and 433 and configured to transmit or receive RF signals, wherein the second side member 223 may include a sliding cover surface (e.g., the sliding cover surface 425 in FIG. 14) disposed to face the one surface of the first side member 221, and wherein the sliding cover surface 425 may include a second non-conductive portion (e.g., the first outer segment 561 in FIG. 14) disposed on a portion facing the first non-conductive portion 551 when the second side member 223 overlaps the first side member 221 most widely, and a third non-conductive portion (e.g., the sixth outer segment 1403 in FIG. 14) disposed on a portion facing the first non-conductive portion 551 when the second side member 223 overlaps the first side member 221 most narrowly.

The electronic device may further include an insulating member (e.g., the insulating member 1940 in FIG. 20A) disposed on an inner surface of the sliding cover surface 425 facing the one surface of the first side member 221. The insulating member 1940 may be an insulating tape.

The electronic device may further include a third side member (e.g., the third side member 325 in FIG. 3) surrounding another portion of the space at the other side of the first side member 221 and configured to be movable toward the other side of the first side member 221, and the third side member 325 may include the same components as the second side member 223 and may be arranged to be symmetrical to the second side member 223. The exposed width of the flexible display 210 may be adjusted based on the movement of the second side member 223 or the movement of the third side member 325.

An electronic device (e.g., the electronic device 1800 in FIG. 18A) according to various embodiments of the disclosure may include: a housing including a first plate (e.g., the electronic device 200 in FIG. 2) facing a first direction, a second plate (e.g., the second plate 203 in FIG. 2) facing a second direction opposite the first direction, and a space defined between the first plate 201 and the second plate 203; a first side member (e.g., the first side member 221 in FIG. 2) surrounding a portion of the space and including multiple conductive portions (e.g., the multiple conductive portions 431, 432, and 433 in FIG. 4) disposed on one surface thereof and at least one first non-conductive portion (e.g., the first inner segment 451 or the second inner segment 453 in FIG. 4B) disposed between the multiple conductive portions 431, 432, and 433; a second side member (e.g., the second side member 460 in FIG. 18A) surrounding another portion of the space at one side of the first side member 221 and configured to be movable toward the one side of the first side member 221; a flexible display 210 exposed through the first plate 201, an exposed width of the flexible display being adjusted based on the movement of the second side member 460; a wireless communication circuit (e.g., the communication module 190 in FIG. 1) electrically connected to at least one of the multiple conductive portions 431, 432, and 433 and configured to transmit or receive RF signals, wherein the second side member 460 may be disposed so as to expose the one surface of the first side member 221 and may include a sliding cover surface (e.g., the fifth surface 425 in FIG. 4B) located adjacent to a boundary of the one surface in the second direction when viewed from above the one surface, and wherein the sliding cover surface 425 may include at least one second non-conductive portion (e.g., the first outer segment 461 in FIG. 18A) disposed on a portion arranged in a straight line (e.g., the straight line 1801 in FIG. 18A) with the first non-conductive portion 451 or 453 when viewed from above the one surface when the second side member 460 overlaps the first side member 221 most widely, and may not be located adjacent to the first non-conductive portion 451 or 453 when viewed from above the one surface when the second side member 460 overlaps the first side member 221 most narrowly or does not overlap the first side member 221.

The electronic device may further include a third side member (e.g., the third side member 325 in FIG. 3) surrounding another portion of the space at the other side of the first side member 221 and configured to be movable toward the other side of the first side member 221, and the third side member 325 may include the same components as the second side member 460 and may be arranged to be symmetrical to the second side member 460.

The exposed width of the flexible display 210 may be adjusted based on the movement of the second side member 460 or the movement of the third side member 325.

The multiple conductive portions 431, 432, and 433 may include a first conductive portion (e.g., the first conductive portion 431 in FIG. 4B), a second conductive portion (e.g., the second conductive portion 432 in FIG. 4B)), and a third conductive portion (e.g., the third conductive portion 433 in FIG. 4B), the first conductive portion 431 may be disposed between the second conductive portion 432 and the third conductive portion 433, the at least one first non-conductive portion 451 or 453 may include a third non-conductive portion (e.g., the first inner segment 451 in FIG. 4B) disposed between the first conductive portion 431 and the second conductive portion 432 and a fourth non-conductive portion (e.g., the second inner segment 453 in FIG. 4B) disposed between the first conductive portion 431 and the third conductive portion 433, and the third non-conductive portion 451 may be arranged on the straight line 1801 with the second non-conductive portion 461 when viewed from above the one surface when the second side member 460 overlaps the first side member 221 most widely.

Some of the multiple conductive portions 431, 432, and 433 may include a first protrusion (e.g., the first protrusion 2401 in FIG. 24) protruding in the second direction, the second side member 460 may include a fourth conductive portion 562 located adjacent to the second non-conductive portion 461 and including a second protrusion (e.g., the second protrusion 2402 in FIG. 24) protruding in the first direction, the second protrusion 2402 may come into contact with the first protrusion 2401 so as to form an electrical path when the second side member 460 overlaps the first side member 221 most narrowly or does not overlap the first side member, and the fourth conductive portion 562 may be connected to a ground of a printed circuit board 541.

Figure 2:
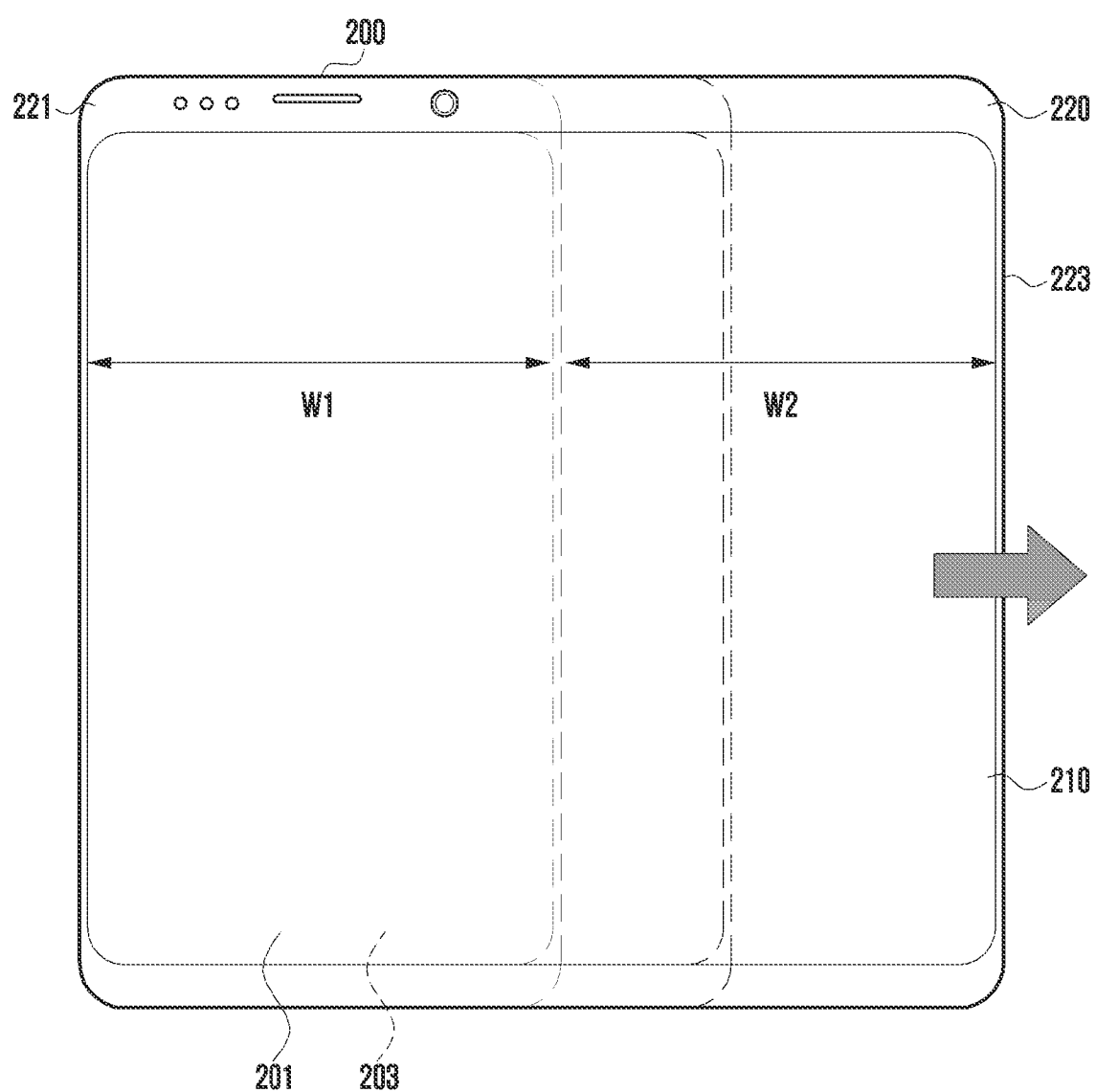
FIG. 2 is an illustration illustrating a mode in which a display is expanded in an electronic device according to various embodiments of the disclosure.

FIG. 2 is an illustration illustrating a mode in which an electronic device according to various embodiments of the disclosure expands a display.

Referring to FIG. 2, an electronic device 200 (e.g., the electronic device 101 in FIG. 1) according to an embodiment of the disclosure may include: a housing including a first plate 201 facing a first direction (e.g., the front surface), a second plate 203 facing a second direction opposite the first direction (e.g., the rear surface), and a space defined between the first plate 201 and the second plate 203; and a display 210 made of a flexible material and exposed through the first plate 201 (e.g., the display device 160 in FIG. 1).

According to an embodiment, the housing may include a side member 220, and the side member 220 may include a first side member 221 surrounding a portion of the space defined in the housing, and a second side member 223 surrounding another portion of the space. For example, the second side member 223 may be disposed at one side of the first side member 221.

According to an embodiment, the first side member 221 may be fixedly disposed, and the second side member 223 may be disposed to be movable in a sliding manner. For example, the second side member 223 may be disposed to be slidable toward one side of the first side member 221. According to an embodiment, the second side member 223 is movable toward the first side of the first side member 221 up to a second width W2.

According to an embodiment, the display 210 may have a flexible material, and the width of the exposed area thereof may be adjusted based on the movement of the second side member 223. For example, at least a portion of the display 210 may be normally exposed to have a first width W1, and when the second side member 223 moves in a sliding manner, the display 210 may be exposed in the state in which another portion of the display 210 further extends up to the second width W2.

In the electronic device 200 according to an embodiment, the width of the display 210 exposed through the first plate may be adjusted as follows by moving the second side member 223 in a sliding manner
  the minimum width of the display 210: the first width W1,
  the maximum width of the display 210: the sum of the first width W1 and the second width W2

Figure 3:
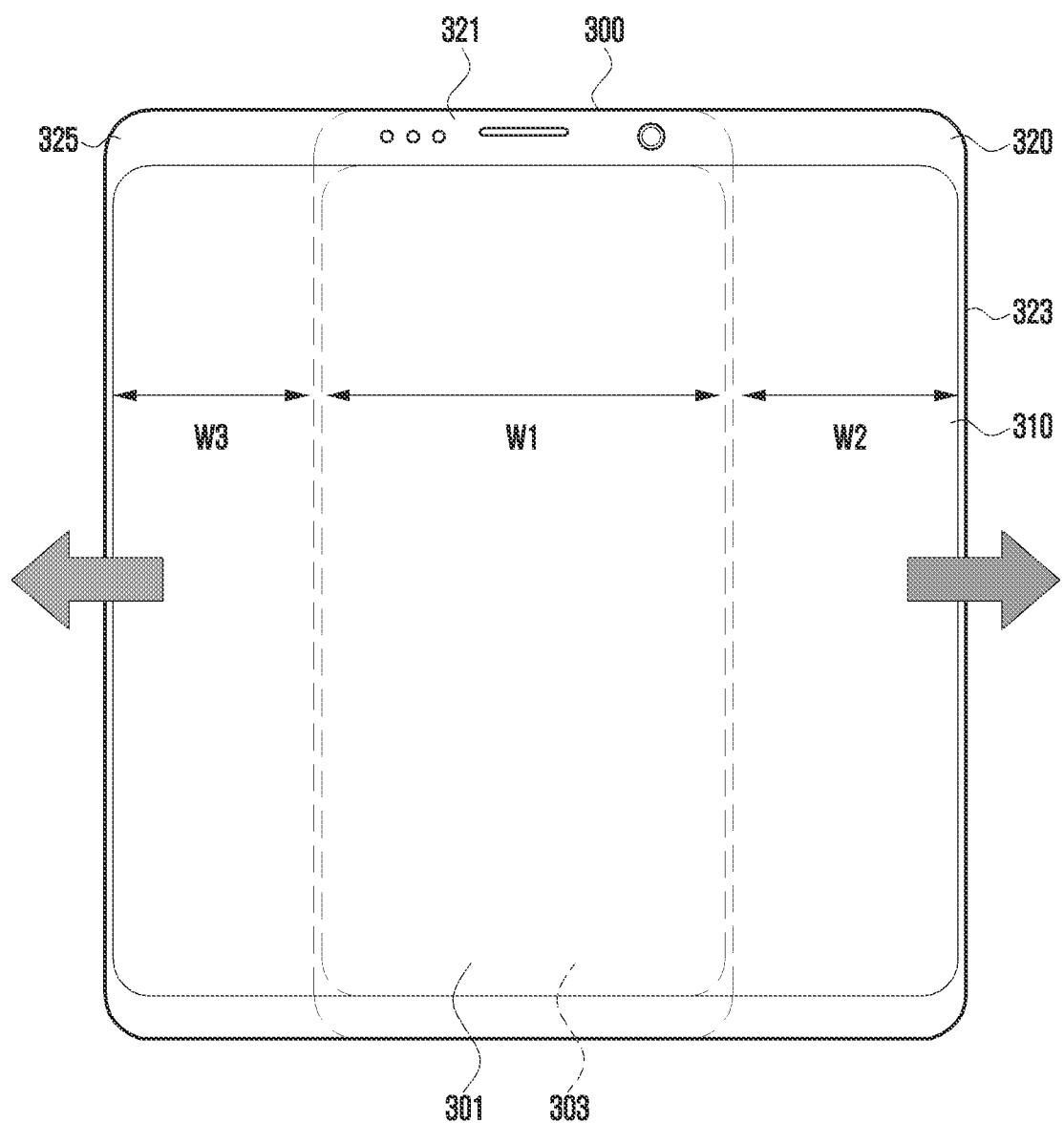
FIG. 3 is another illustration illustrating a mode in which a display is expanded in an electronic device according to various embodiments of the disclosure.

FIG. 3 is another illustration illustrating a mode in which a display is expanded in an electronic device according to various embodiments of the disclosure.

Referring to FIG. 3, an electronic device 300 (e.g., the electronic device 101 in FIG. 1) according to another embodiment of the disclosure may include: a housing including a first plate 301 facing a first direction (e.g., the front surface), a second plate 303 facing a second direction opposite the first direction (e.g., the rear surface), and a space defined between the first plate 301 and the second plate 303; and a display 310 made of a flexible material and exposed through the first plate 303 (e.g., the display device 160 in FIG. 1).

According to an embodiment, the housing may include a side member 320, and the side member 320 may include a first side member 321 surrounding a portion of the space defined by the housing, a second side member 323 surrounding another portion of the space, and a third side member 325 surrounding still another portion of the space. For example, the second side member 323 may be disposed at one side of the first side member 321, and the third side member 325 may be disposed the other side of the first side member 321. For example, the second side member 323 and the third side member 325 may be located to face each other when viewed from above the display 310. The first side member 321 may be located between the second side member 323 and the third side member 325 when viewed from above the display 310.

According to an embodiment, the first side member 321 may be fixedly disposed, and the second side member 323 may be disposed to be movable in a sliding manner. For example, the second side member 323 may be disposed to be slidable toward one side of the first side member 321. According to an embodiment, the second side member 323 is movable toward the first side of the first side member 321 up to a second width W2.

According to an embodiment, the third side member 325 may be disposed to be movable in a sliding manner. For example, the third side member 325 may be disposed to be slidable toward the other side of the first side member 321. According to an embodiment, the third side member 325 is movable toward the other side of the first side member 321 up to a third width W3.

According to an embodiment, the display 310 may have a flexible material, and the width of the exposed area thereof may be adjusted based on the movement of the second side member 323. For example, at least a portion of the display 310 is normally exposed to have a first width W1, and when the second side member 323 moves in a sliding manner, the display 310 may be exposed in the state in which another portion further extends up to the second width W2.

According to an embodiment, the width of the exposed area of the display 310 may be adjusted based on the movement of the third side member 325. For example, when the third side member 325 moves in a sliding manner, another portion of the display 310 may be exposed in the state in which the other portion further extends up to the third width W3.

In the electronic device 300 according to an embodiment, the width of the display 310 exposed through the first plate may be adjusted as follows by moving the second side member 323 in a sliding manner.

the minimum width of the display 310: the first width W1,
the maximum width of the display 310: the sum of the widths from the first width W1 to the third width W1 (W1+W2+W3)

Hereinafter, for convenience of description, the state in which the width of the display 310 is expanded to the maximum by sliding of the second side member 323 or the third side member 325 will be referred to as the "expanded display 310 state", and the state in which the width of the display 310 is reduced to the minimum by sliding of the second side member 323 or the third side member 325 will be referred to as the "reduced display 310 state". For example, the "expanded display 310 state" may be the state in which the second side member 323 or the third side member 325 has moved from the first side member 321 by the first width W1 or the second width W2, and the "reduced display 310 state" may be the state in which the second side member 323 or the third side member 325 does not move from the first side member 321 and, for example, the state in which the display 310 is exposed by the first width W1. As another example, the "expanded display 310 state" may be the state in which the second side member 323 or the third side member 325 is maximally distant from the first side member 321, and the "reduced display 310 state" may be the state in which the second side member 323 or the third side member 325 does not move from the first side member 321. As still another example, the "expanded display 310 state" may be the state in which the second side member 323 or the third side member 325 overlaps the first side member 321 most narrowly or does not overlap the first side member 321, and the "reduced display 310 state" may be the state in which the second side member 323 or the third side member 325 overlaps the first side member 321 most widely.

FIGS. 4A and 4B are perspective views of an electronic device 400 according to an embodiment of the disclosure; For example, FIG. 4A may be a perspective view illustrating the case in which the electronic device 400 according to an embodiment of the disclosure is in the "reduced display 410 state", and FIG. 4B may be a perspective state illustrating the case in which the electronic device 400 according to an embodiment of the disclosure is in the "expanded display 410 state".

Referring to FIGS. 4A and 4B, an electronic device 400 (e.g., the electronic device 200 in FIG. 2) according to an embodiment of the disclosure may include a first side member 450 (e.g., the first side member 221 in FIG. 2) surrounding a portion of a space defined in a housing, a second side member 460 (e.g., the second side member 223 in FIG. 2) surrounding another portion of the space, and a display 410 (e.g., the display 210 in FIG. 2) the exposed width of which is adjusted based on the movement of the second side member 460.

According to an embodiment, the first side member 450 may have a first size A1, and the second side member 460 may have a second size A2 larger than the first size A1. For example, the second side member 460 may be located outside the first side member 450 and may overlap at least a portion of the first side member 450. According to an embodiment, the second side member 460 may overlap at least a portion of the first side member 450 in the "reduced display 410 state", and in the "expanded display 410 state", the overlapped portion between the second side member 460 and the first side member 450 may be narrower than that in the "reduced display 410 state". According to another embodiment, the second side member 460 may not overlap the first side member 450 in the "expanded display 410 state".

According to an embodiment, the first side member 450 may include a first surface 421, a second surface 422 disposed at one side of the first surface 421 and bent from the first surface 421, and a third surface 423 disposed at the other side of the first surface 421 parallel to the second surface 422.

According to an embodiment, the second side member 460 may include a fourth surface 424 disposed to face the first surface 421, a fifth surface 425 disposed at one side of the fourth surface 424 and coupled to the second surface 422 of the first side member 450 in a sliding manner while facing the second surface 422, and a sixth surface 426 disposed at the other side of the fourth surface 424 and coupled to the third surface 423 of the first side member 450 in a sliding manner while facing the third surface 423. For example, the fifth surface 425 or the sixth surface 426 of the second side member 460 may be a sliding cover surface for the first side member 450. According to an embodiment, the "sliding cover surface" may be a surface that is disposed to face the third surface 423 of the first side member 450 and overlaps or does not overlap the third surface 423 of the first side member 450 while moving in a sliding manner.

According to an embodiment, during the "reduced display 410 state", the fifth surface 425 of the second side member 460 may face a portion of the second surface 422 of the first side member 450 while being located outside the second surface 422 of the first side member 450, and the sixth surface 426 of the second side member 460 may face a portion of the third surface 423 of the first side member 450 while being located outside the third surface 423 of the first side member 450. According to an embodiment, during the "expanded display 410 state", the fifth surface 425 of the second side member 460 may not face the second surface 422 of the first side member 450, and the sixth surface 426 of the second side member 460 may not face the third surface 423 of the first side member 450.

According to an embodiment, a first conductive portion 431, a second conductive portion 432, a third conductive portion 433, a first inner segment 451, and a second inner segment 453 may be disposed on the second surface 422 of the first side member 450. According to an embodiment, the first inner segment 451 may be disposed between the first conductive portion 431 and the second conductive portion 432, and the second inner segment 453 may be disposed between the first conductive portion 431 and the third conductive portion 433.

According to an embodiment, each of the first conductive portion 431, the second conductive portion 432, and the third conductive portion 433 may be a radiator, for example, an antenna, configured to emit RF signals output from a communication module (e.g., the communication module 190 in FIG. 1).

According to an embodiment, the RF signals output from the communication module 190 may include first to third RF signals. According to an embodiment, the first RF signal may be a signal related to a low-frequency band, and the second RF signal and the third RF signal may be signals related to a medium-frequency band or a high-frequency band. For example, the first RF signal may have a communication frequency of a low or mid band (low band: ~1 GHz, mid band: ~2.1 GHz), and the second RF signal and the third RF signal may have a communication frequency of a high or ultra-high band (high band: ~2.7 GHz, ultra-high band: ~3.5 GHz). According to some embodiments, the second RF signal may be a signal intended for Bluetooth or Wi-Fi communication of a 2.4 GHz or 5 GHz ISM band.

According to an embodiment, the first conductive portion 431 may be a first antenna ANT #1 for resonating the first RF signal output from the communication module 190, the second conductive portion 432 may be a second antenna ANT #2 for resonating the second RF signal output from the communication module 190, and the third conductive portion 433 may be a third antenna ANT #3 for resonating the third RF signal output from the communication module 190. According to an embodiment, the first antenna ANT #1, the second antenna ANT #2, and the third antenna ANT #3 are disposed as a planner inverted F antenna (PIFA) type antenna, and may be connected to at least one feeding and one or more grounds.

According to an embodiment, at least one outer segment, for example, a first outer segment 461, may be disposed on the fifth surface 425 of the second side member 460. According to an embodiment, the first outer segment 461 may be disposed to face the first inner segment 451 of the first side member during the "reduced display 410 state". For example, the fifth surface 425 of the second side member 460 may have a first outer segment 461 disposed in a portion facing at least one inner segment of the first side member 450, for example, the inner segment 451, while the second side member 460 does not move from the first side member 450. In the fifth surface 425 of the second side member 460, the first outer segment 461 may not overlap the first inner segment 451 when viewed from above the fifth surface 425 when the second side member 460 is at the maximum distance from the first side member 450 (e.g., to the second width W2 in FIG. 2).

In the electronic device 400 according to various embodiments of the disclosure, while the second side member 460 does not move from the first side member 450, the first outer segment 461 is disposed in a portion facing an inner segment of the first side member 450, for example, the first inner segment 451. Thus, the characteristics of the antennas of the electronic device 400 can be maintained constant irrespective of whether or not the second side member disposed outside the first side member 450 moves in a sliding manner.

According to an embodiment, a second outer segment 463 or a third outer segment 465 may be further disposed on the fourth surface 424 of the second side member 460.

According to an embodiment, the structure of the third surface 423 of the first side member 450 may have substantially the same structure as the structure of the second surface 422, and the structure of the sixth surface 426 of the second side member 460 may be substantially the same as the structure of the fifth surface 425. For example, multiple conductive portions (not illustrated) may be disposed on the third surface 423 of the first side member 450, and at least one inner segment (not illustrated) disposed between the multiple conductive portions. On the sixth surface 426 of the second side member 460, an outer segment (not illustrated) may be further disposed in a portion facing the inner segment disposed on the third surface 423 of the first side member 450 during the "reduced display 410 state".

Figure 5:
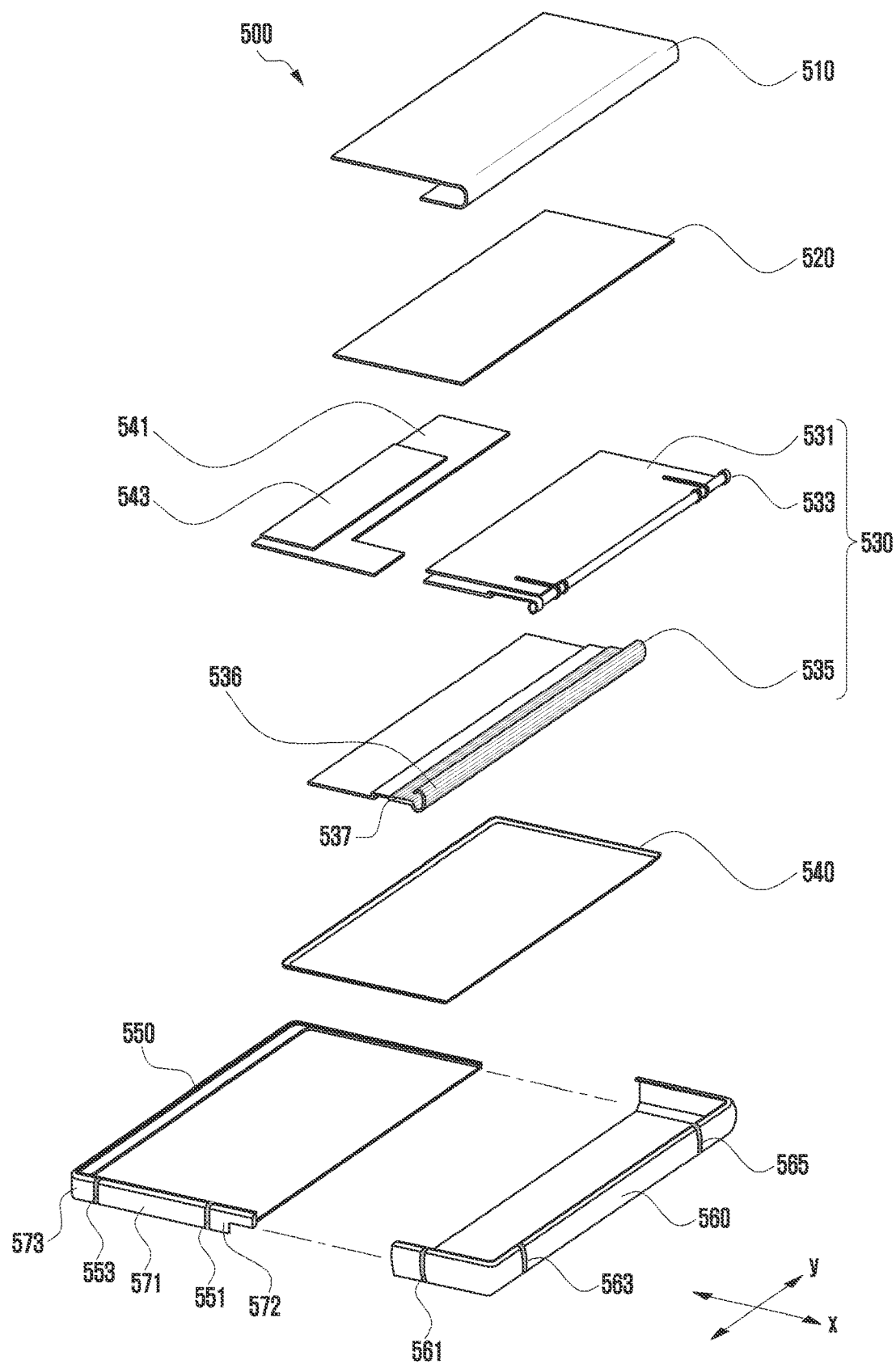
FIG. 5 is an exploded perspective view illustrating another electronic device according to various embodiments of the disclosure.
Figure 6:
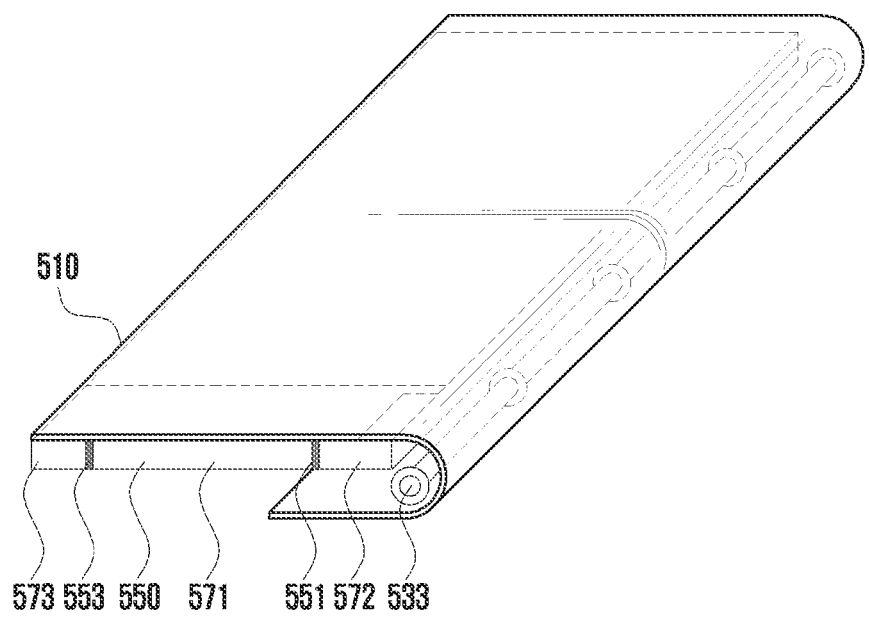
FIG. 6 is a perspective view illustrating a coupling structure between a first side member and a display.

FIG. 5 is an exploded perspective view illustrating an electronic device 500 according to various embodiments of the disclosure. FIG. 6 is a perspective view illustrating a coupling structure between a first side member 550 and a display 510.

Referring to FIGS. 5 and 6, an electronic device 500 (e.g., the electronic device 200 in FIG. 2) according to an embodiment of the disclosure may include a display 510 (e.g., the display 210 in FIG. 2), a first support member 520, a printed circuit board 541, a sliding substrate 531, an articulated hinge 535, a second support member 540, a first side member 550 (e.g., the first side member 221 in FIG. 2), or a second side member 560 (e.g., the second side member 223 in FIG. 2).

According to an embodiment, at least a portion of the display 510 may be exposed through a first plate (not illustrated) disposed above the display 510. According to an embodiment, the exposed area of the display 510 may be adjusted based on the movement of the second side member 560. For example, when the second side member 560 moves in a sliding manner, the exposed area of the display 510 may increase, and when the second side member 560 returns in a sliding manner, the exposed area of the display 510 may decrease. According to an embodiment, at least side one portion of the display 510 may be rolled in a round shape not to be exposed during the "reduced display 510 state", and at least a portion of the portion rolled in the round shape may be at least partially flattened during the "expanded display 510 state".

According to an embodiment, the first support member 520 may be disposed between the display 510 and the printed circuit board 541. According to an embodiment, the first support member 520 may be formed of, for example, a metal material and/or a non-metal material (e.g., a polymer). According to an embodiment, the display 510 may be coupled to one surface of the first support member, and the printed circuit board 541 may be coupled to the other surface of the first support member.

According to an embodiment, components 543, such as a processor (e.g., the processor 120 in FIG. 1), a memory (e.g., the memory 130 in FIG. 1), and/or an interface (e.g., the interface 177 in FIG. 1), may be mounted on the printed circuit board 541. According to an embodiment, the processor 120 may include one or more of, for example, a central processor, an application processor, a graphics processor, an image signal processor, a sensor hub processor, or a communication processor. According to an embodiment, the memory 130 may include, for example, a volatile memory or a nonvolatile memory. According to an embodiment, the interface 177 may include a high-definition multimedia interface (HDMI), a universal serial bus (USB) interface, an SD card interface, and/or an audio interface. According to an embodiment, the interface 177 may electrically or physically connect the electronic device 500 to an external electronic device (not illustrated), and may include a USB connector, an SD card/MMC connector, or an audio connector.

According to an embodiment, the printed circuit board 541 may be connected to a battery (e.g., the battery 189 in FIG. 1). For example, the battery 189 is a device for supplying power to at least one component of the electronic device 500, and may include, for example, a non-rechargeable primary battery, a rechargeable secondary battery, or a fuel cell. According to an embodiment, at least a portion of the battery 189 may be disposed on substantially the same plane as, for example, the printed circuit board 541. According to an embodiment, the battery 189 may be integrally disposed within the electronic device 500, or may be removably mounted on the electronic device 500.

According to an embodiment, the second side member 560 may be coupled to a hinge structure 530 configured to adjust the exposed area of the display 510. For example, the hinge structure 530 may include a sliding substrate 531, a hinge shaft 533, or an articulated hinge 535.

According to an embodiment, the sliding substrate 531 may be coupled to the hinge shaft 533 connected to one side of the second side member 560, and may be moved as the second side member 560 slides in the width direction of the display 510 (e.g., the x direction in FIG. 5). For example, the sliding substrate 531 may be disposed inside the second side member 560 so as to be slidable in the width direction of the display 510 (e.g., the x direction in FIG. 5). According to an embodiment, the sliding substrate 531 may be disposed to support the display 510 while the second side member 560 is sliding. According to an embodiment, the hinge shaft 533 may be disposed at one end of the sliding substrate 531 in the longitudinal direction of the display 510 (e.g., the y direction in FIG. 5), and may rotate when the second side member 560 slides.

According to an embodiment, the articulated hinge 535 may include multiple joints surrounding the hinge shaft 533. For example, the articulated hinge 535 may be coupled to the hinge shaft 533 in the form of a chain while surrounding at least a portion of the hinge shaft 533, and when the hinge shaft 533 rotates, a portion coupled to the hinge shaft 533 may be changed and moved. According to an embodiment, the articulated hinge 535 may include a first portion 536 facing a first direction (e.g., the first plate), and a second portion 537 facing a second direction (e.g., the second plate). For example, the first portion 536 of the articulated hinge 535 may be disposed on the same plane as the upper portion of the hinge shaft 533 facing the first direction, and the second portion 537 may be disposed on the same plane as the lower portion of the hinge shaft 533 facing the second direction. According to an embodiment, the length of each of the first portion 536 and the second portion 537 of the articulated hinge 535 may be adjusted based on the rotation of the hinge shaft 533. For example, when the hinge shaft 533 rotates in a first rotation direction (e.g., clockwise), the length of the second portion 537 becomes shorter while the length of the first portion 536 becomes longer, and when the hinge shaft 533 rotates in the second rotation direction (e.g., counterclockwise), the length of the second portion 537 may become longer while the length of the first portion 536 becomes shorter. According to an embodiment, as the length of the first portion 536 of the articulated hinge 535 increases, the exposed area of the display 510 increases, and as the length of the second portion 537 of the articulated hinge 535 increases, the exposed area of the display 510 may decrease.

According to an embodiment, the second support member 540 may be disposed between the articulated hinge 535 and the second side member 560 to support the articulated hinge 535. According to an embodiment, the second support member 540 may be formed of, for example, a metal material and/or a non-metal material (e.g., a polymer).

According to an embodiment, the first side member 550 and the second side member 560 may be disposed to surround the space between a first plate (not illustrated) facing a first direction (e.g., the front surface) and a second plate (not illustrated) facing a second direction (e.g., the rear surface) opposite the first direction. According to an embodiment, the first side member 550 may be fixed, and the second side member 560 may be movable in a sliding manner. For example, the second side member 560 may be disposed to be slidable toward one side of the first side member 550.

According to an embodiment, at least a portion of the first side member 550 may be made of a metal, and may be used as a radiator (antenna) for radiating RF signals. For example, the first side member 550 may include multiple conductive portions 571, 572, and 573 (e.g., the first conductive portion 431, the second conductive portion 432, or the third conductive portion in FIG. 4B), and the multiple conductive portions 571, 572, and 573 may be segmented from each other by the inner segments 551 and 553 (e.g., the first inner segment 451 or the second inner segment 453 in FIG. 4B). According to an embodiment, the second side member 560 may include outer segments 561, 563, and 565 (e.g., the first outer segment 461, the second outer segment 463, or the third outer segment in FIG. 4B). At least one 561 (e.g., the first outer segment 461 in FIG. 4B) of the outer segments 561, 563, and 565 of the second side member 560 may be disposed to face (to overlap) one 551 (e.g., the first inner segment 451 in FIG. 4B) among the inner segments 551 and 553 of the first side member 550 before the movement of the second side member 560 (e.g., in the reduced display 510 state).

Figure 7:
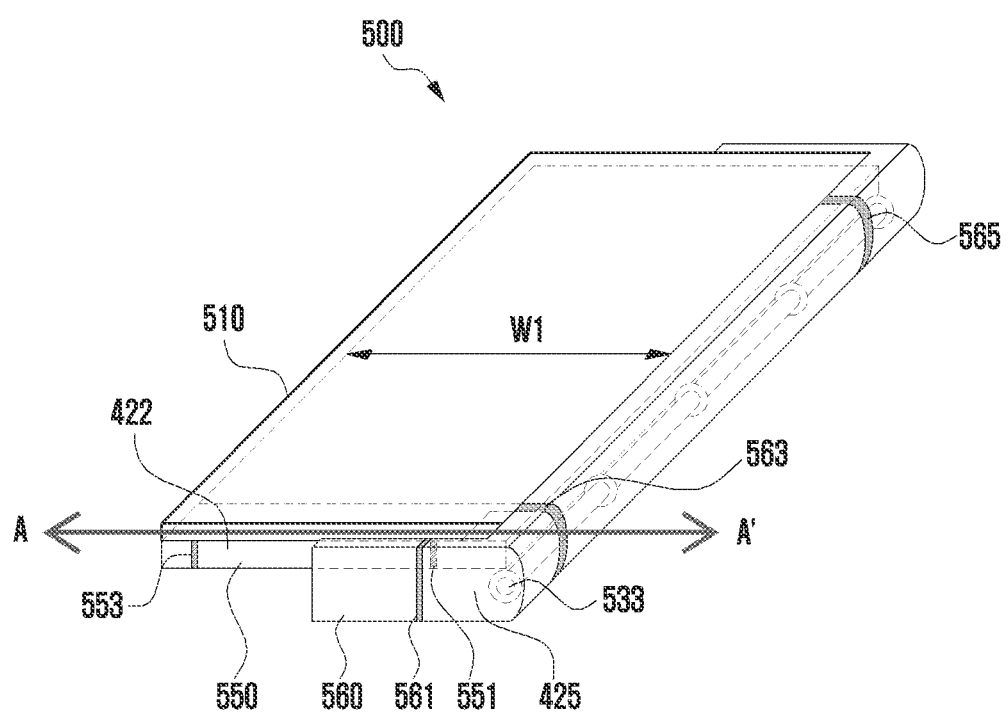
FIG. 7 is a perspective view illustrating the case in which an electronic device according to an embodiment of the disclosure is in the "reduced display state"
Figure 8:
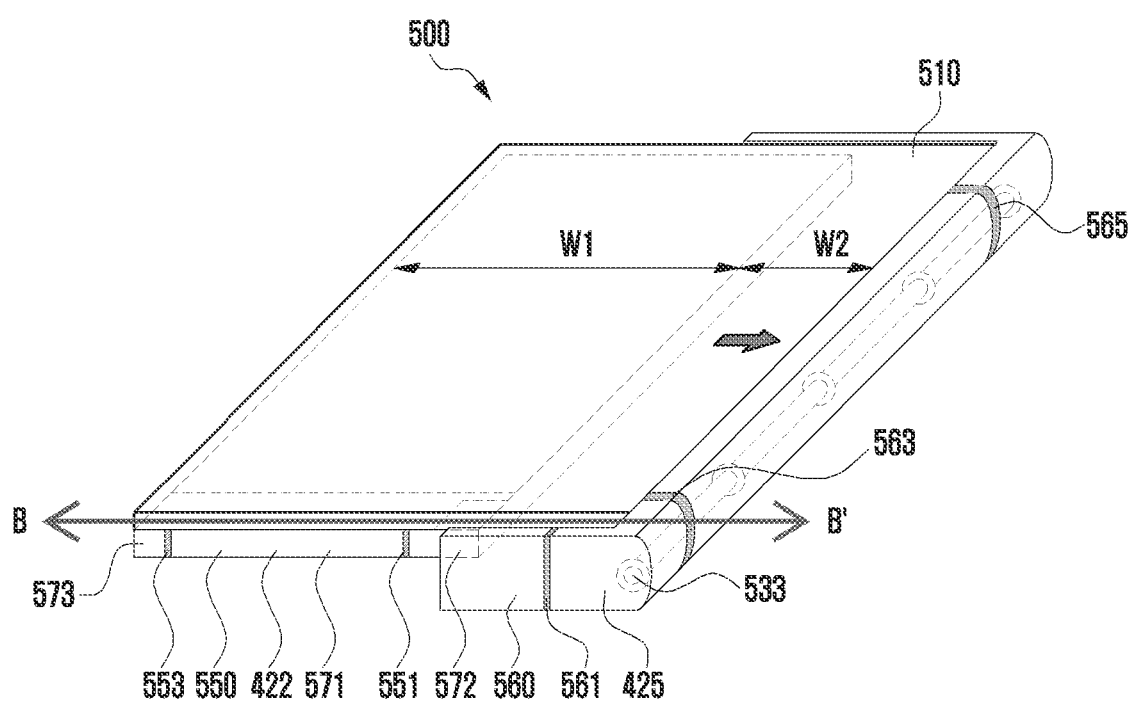
FIG. 8 is a perspective view illustrating the case in which an electronic device according to an embodiment of the disclosure is in the "expanded state of the display"
Figure 9:
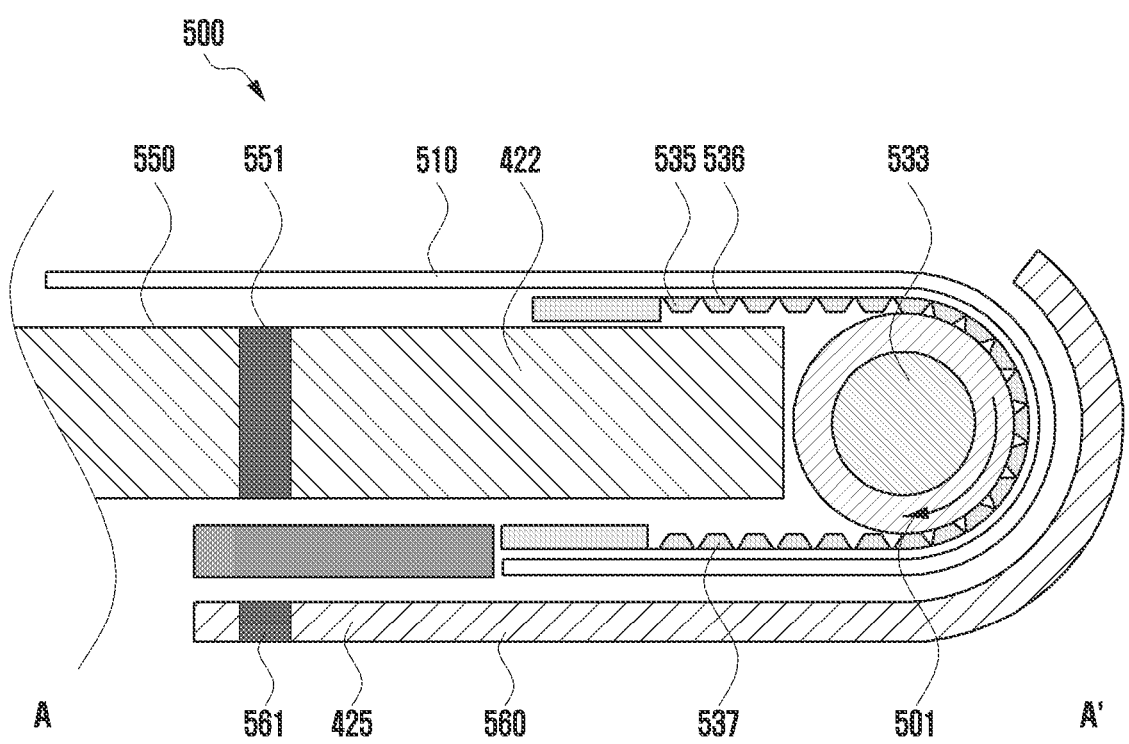
FIG. 9 is a cross-sectional view illustrating a portion of the electronic device taken along line A-A' in FIG. 7.
Figure 10:
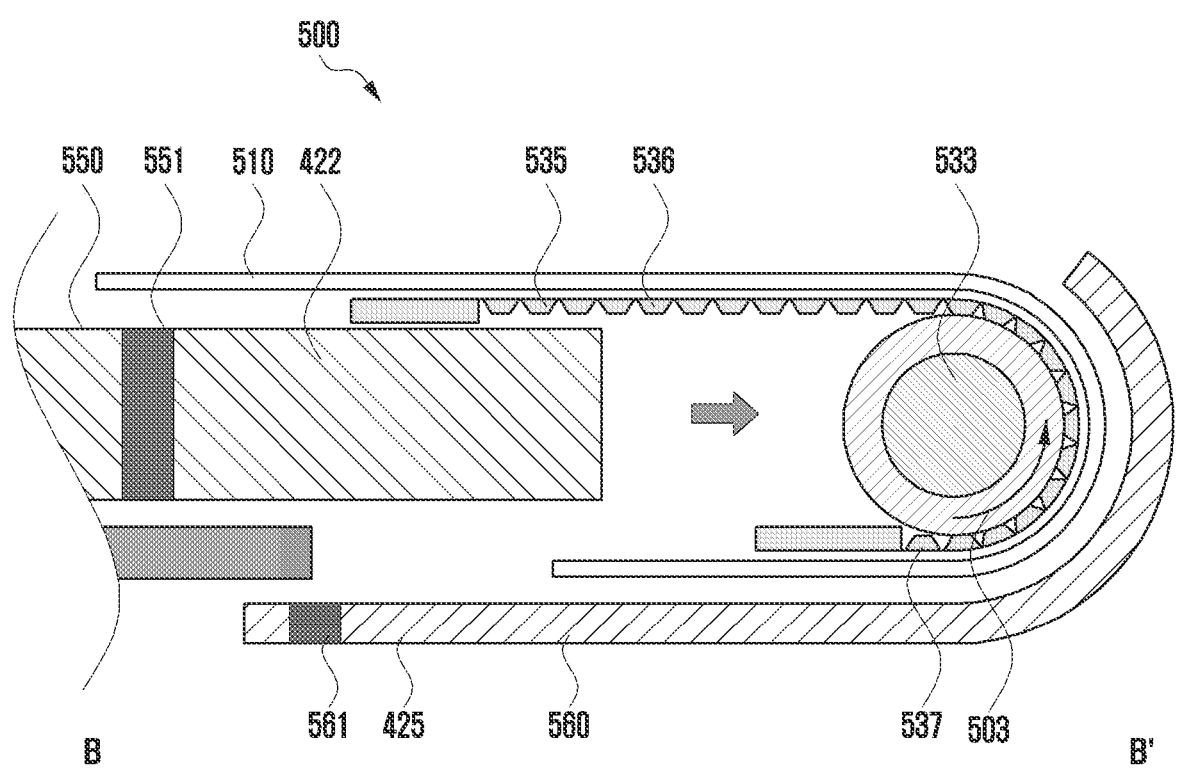
FIG. 10 is a cross-sectional view illustrating a portion of the electronic device taken along line B-B' in FIG. 8.

FIG. 7 is a perspective view illustrating the case in which the electronic device 500 according to an embodiment of the disclosure is in the "reduced display 510 state". FIG. 8 is a perspective view illustrating the case in which the electronic device 500 according to an embodiment of the disclosure is in the "expanded display 510 state". FIG. 9 is a cross-sectional view illustrating a portion of the electronic device 500 taken along line A-A' in FIG. 7. FIG. 10 is a cross-sectional view illustrating a portion of the electronic device 500 taken along line B-B' in FIG. 8.

Referring to FIGS. 7 and 9, the electronic device 500 (e.g., the electronic device 500 in FIG. 5) according to an embodiment of the disclosure may be in the state in which the overlapped portion between a second side member 560 (e.g., the second side member 560 of FIG. 5) and a first side member 550 (e.g., the first side member 550 in FIG. 5) is the widest. For example, in the electronic device 500, by moving the second side member 560 such that the overlapped portion between the second side member 560 and the first side member 550 increases, the hinge shaft 533 (e.g., the hinge shaft 533 in FIG. 5) may be rotated in a first direction 501 (e.g., clockwise). The electronic device 500 may be switched into the "reduced display 510 state" in which the display 510 (e.g., the display 510 in FIG. 5) is exposed by a first width W1 (e.g., the first width W1 in FIG. 2) by moving the articulated hinge 535 (e.g., the multi-hinge 535 in FIG. 5) through the rotation of the hinge shaft 533.

According to an embodiment, on one surface 422 (e.g., the second surface 422 in FIG. 2) of the first side member 550, inner segments 551 and 553 (e.g., the first inner segment 451 or the first inner segment 453 in FIG. 4B) may be disposed.

According to an embodiment, the second side member 560 may include a sliding cover surface 425 (e.g., the fifth surface 425 in FIG. 2) disposed outside the one surface 422 of the first side member 550 and facing the one surface 422. While the electronic device 500 is in the "reduced display 510 state", the sliding cover surface 425 may face at least one 551 (e.g., the first inner segment 451 in FIG. 4B) of the inner segments 551 and 553, and an outer segment 561 (e.g., the first outer segment 461 in FIG. 4B) may be disposed on the facing portion. According to an embodiment, in addition to the portion facing the inner segment 551, the second side member 560 may include one or more other segments 563 and 565 (e.g., the second outer segment 463 or the third outer segment 465 in FIG. 4B) disposed thereon.

Referring to FIGS. 8 and 10, the electronic device 500 according to an embodiment of the disclosure may be in the state in which the second side member 560 has moved by a second width W2 (e.g., the second width W2 in FIG. 2) from the first side member 550. For example, in the electronic device 500, by moving the second side member 560 such that the overlapped portion between the second side member 560 and the first side member 550 decreases, the hinge shaft 533 may be rotated in a second direction 503 (e.g., counterclockwise). The electronic device 500 may be switched into the "expanded display 510 state" in which the display 510 is exposed by a width corresponding to the sum of the first width W1 and the second width W2 by moving the articulated hinge 535 through the rotation of the hinge shaft 533.

According to an embodiment, while the electronic device 500 is in the "expanded display 510 state", the sliding cover surface 425 of the second side member 560 may not face the inner segments 551 and 553 of the first side member 550. For example, while the electronic device 500 is in the "expanded display 510 state", the inner segments 551 and 553 of the first side member 550 may be exposed to the outside.

According to another embodiment, while the electronic device 500 is in the "expanded display 510 state", the sliding cover surface 425 of the second side member 560 may be disposed to face at least one 551 (e.g., the first inner segment 451 in FIG. 4B) of the inner segments 551 and 553, and another outer segment (not illustrated) may be disposed on the facing portion.

Figure 11:
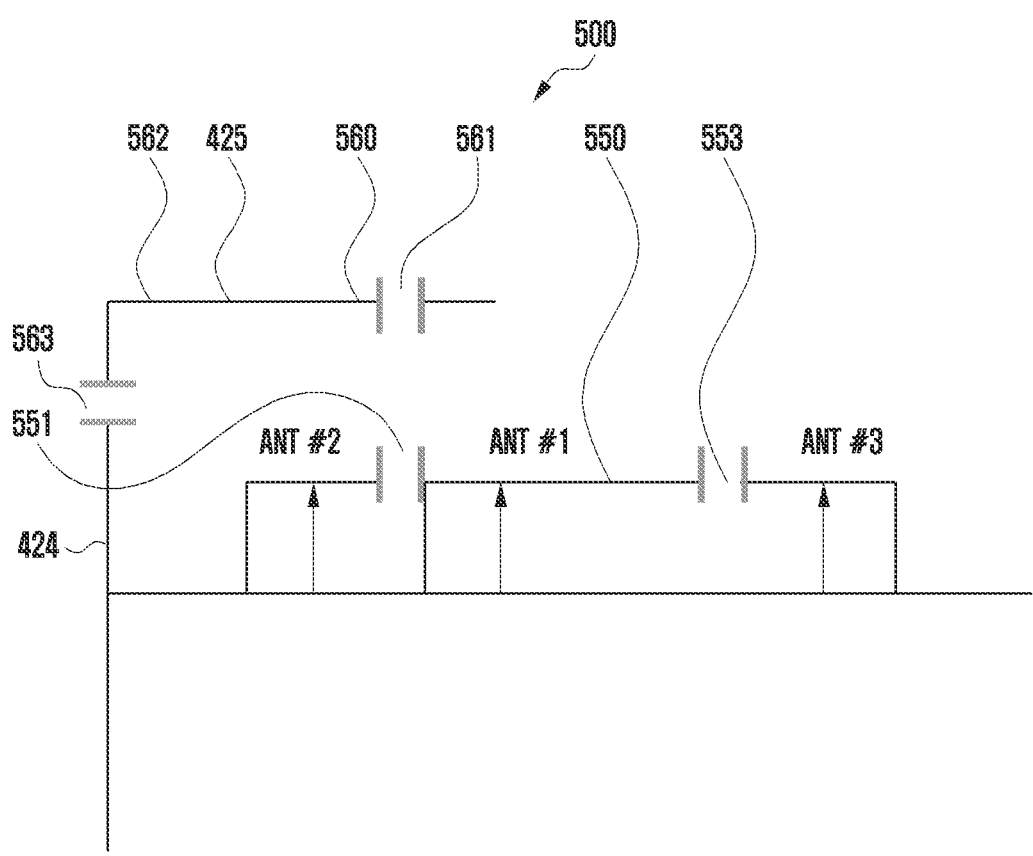
FIG. 11 is an equivalent circuit diagram obtained by modeling antenna portions while an electronic device according to an embodiment of the disclosure is in the "reduced display state"
Figure 12:
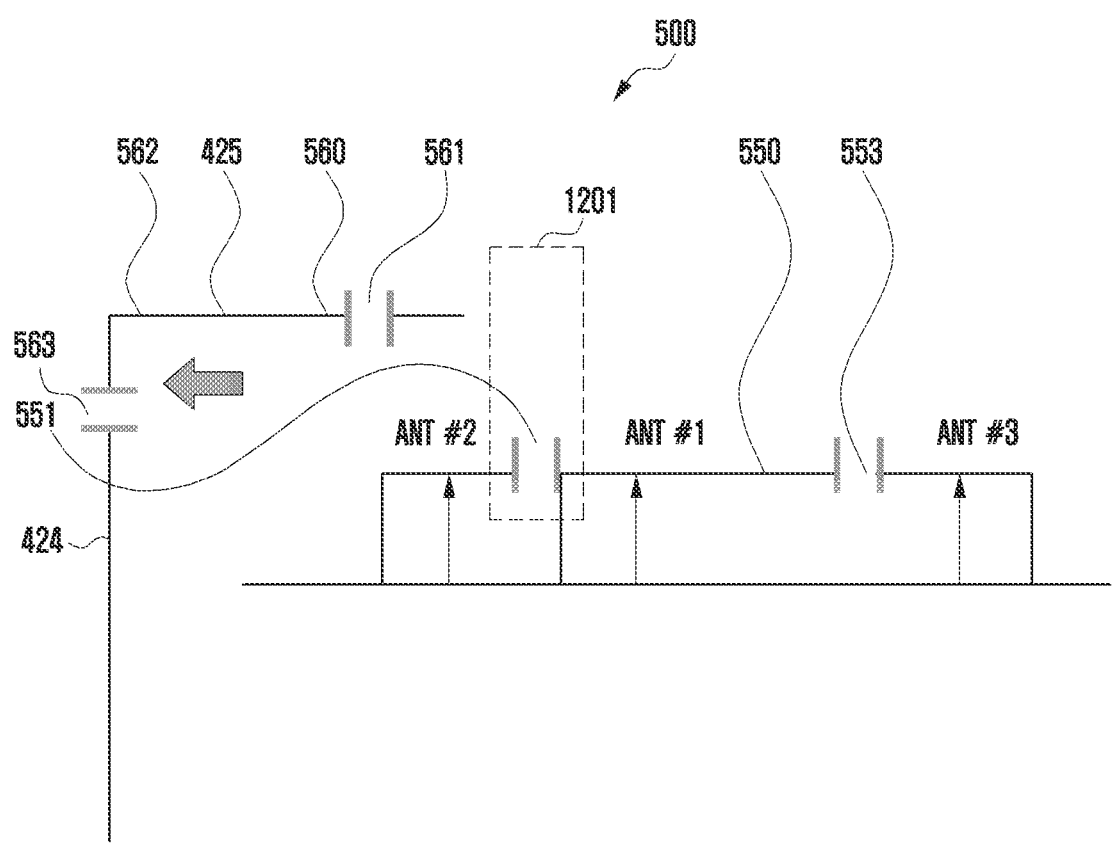
FIG. 12 is an equivalent circuit diagram obtained by modeling antenna portions while an electronic device according to an embodiment of the disclosure is in the "expanded display state"

FIG. 11 is an equivalent circuit diagram obtained by modeling antenna portions while the electronic device 500 according to an embodiment of the disclosure is in the "reduced display state". For example, FIG. 11 may be a view obtained by modeling the antenna portions of the electronic device 500 illustrated in FIG. 7. FIG. 12 is an equivalent circuit diagram obtained by modeling antenna portions while the electronic device 500 according to an embodiment of the disclosure is in the "expanded display state". For example, FIG. 12 may be a view obtained by modeling the antenna portions of the electronic device 500 illustrated in FIG. 8.

Referring to FIGS. 11 and 12, an electronic device 500 (e.g., the electronic device 500 in FIG. 5) according to an embodiment of the disclosure may include a first side member (e.g., the first side member 550 in FIG. 5) made of a metal so as to form multiple antennas ANT #1, ANT #2, and ANT #3. For example, the multiple antennas ANT #1, ANT #2, and ANT #3 may include a first antenna ANT #1 for resonating a first RF signal, a second antenna ANT #2 for resonating a second RF signal, and a third antenna ANT #3 for resonating a second RF signal. According to an embodiment, the first antenna ANT #1 may be disposed between the second antenna ANT #2 and the third antenna ANT #3 and may have a relatively large length.

According to an embodiment, a first inner segment 551 (e.g., the first inner segment 451 in FIG. 4B) may be disposed between the first antenna ANT #1 and the second antenna ANT #2, and a second inner segment 553 (e.g., the second inner segment 453 in FIG. 4B) may be disposed between the first antenna ANT #1 and the third antenna ANT #3.

According to an embodiment, the second side member 560 may be disposed outside the first side member 550 and may include a sliding cover surface 425 (e.g., the fifth surface 425 in FIG. 2) facing the first antenna ANT #1 or the second antenna ANT #2.

Referring to FIG. 11, the sliding cover surface 425 may have a first outer segment 561 (e.g., the first outer segment 461 in FIG. 4B) disposed thereon to face the first inner segment 551 while the electronic device 500 is in the "reduced display (e.g., the display 510 in FIG. 5) state".

According to an embodiment, the second side member 560 may include a bent surface 424 (e.g., the fourth surface 424 in FIG. 2) bent at one side of the sliding cover surface 425, and a second outer segment 563 (e.g., the second outer segment 463 in FIG. 4B) may be disposed on the bent surface 424. According to an embodiment, a fourth conductive portion 562 may be disposed between the first outer segment 561 and the second outer segment 563, and the fourth conductive portion 562 may be electrically connected to a ground of a printed circuit board (e.g., the printed circuit board 541 in FIG. 5). For example, a portion of the fourth conductive portion 562 may be connected to the ground of the printed circuit board 541 via a hinge shaft (e.g., the hinge shaft 533 in FIG. 5) disposed inside the second side member 560.

Referring to FIG. 12, the sliding cover surface 425 according to an embodiment may not face the first inner segment 551 while the electronic device 500 is in the "expanded display 510 state". For example, the sliding cover surface 425 may not face the first inner segment 551 while the second side member 560 moves by a second width W2 (e.g., the second width W2 in FIG. 2). According to an embodiment, as the sliding cover surface 425 moves, the first inner segment 551 may be exposed to the outside (1201).

Figure 13:
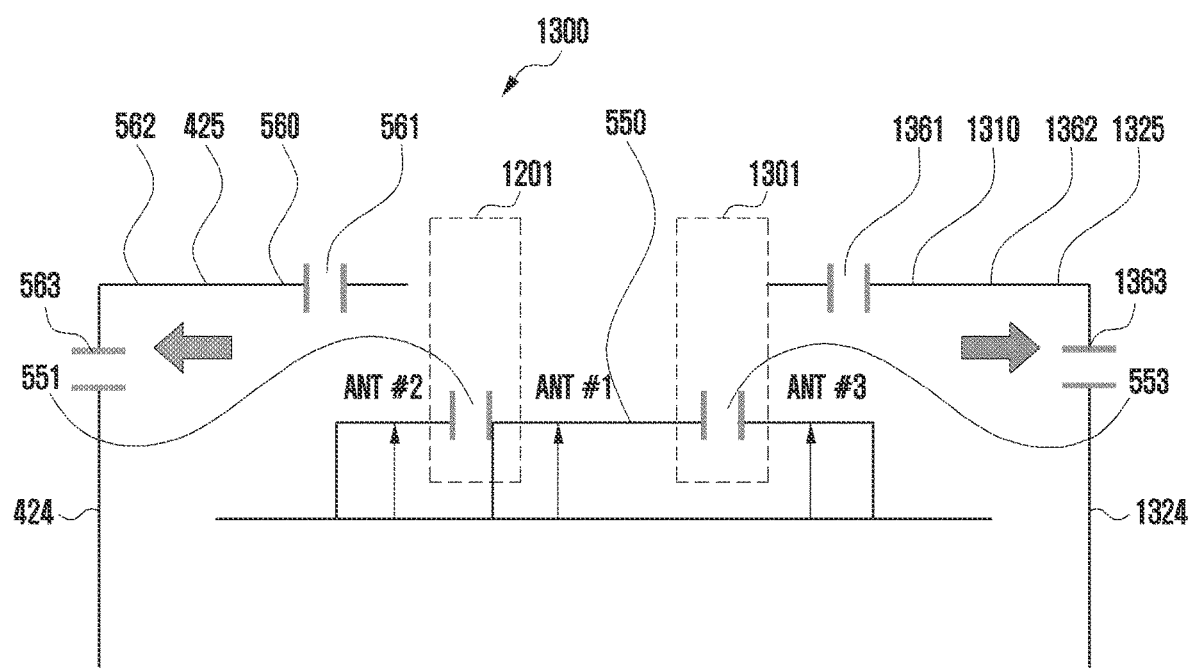
FIG. 13 is an equivalent circuit diagram obtained by modeling antenna portions of an electronic device according to another exemplary embodiment further including a third side member.

FIG. 13 is an equivalent circuit diagram obtained by modeling antenna portions of an electronic device according to another exemplary embodiment further including a third side member. For example, FIG. 13 may be an equivalent circuit diagram obtained by modeling antenna portions while the electronic device is in the "expanded display state". Except for the components described below, the electronic device 1300 illustrated in FIG. 13 may be substantially the same as or similar to the electronic device 500 illustrated in FIG. 12. In FIG. 13, the components substantially the same as those of the electronic device 500 illustrated in FIG. 12 are denoted by the same reference numerals, and as the descriptions of the components denoted by the same reference numerals as FIG. 12, the descriptions of the components described above with respect to FIG. 12 shall apply mutatis mutandis.

Referring to FIG. 13, the electronic device 1300 (e.g., the electronic device 300 in FIG. 3) according to another embodiment of the disclosure may include a first side member 550 (e.g., the first side member 500 in FIG. 5), a second side member 560 (e.g., the second side member 560 in FIG. 5), and a third side member 1310 (e.g., the third side member 325 in FIG. 3).

According to an embodiment, the second side member 560 may be disposed on one side of the first side member 550 and may be movable toward the one side of the first side member 550. For example, the second side member 560 may move toward the one side of the first side member 550 up to a second width W2 (e.g., the second width W2 in FIG. 3).

According to an embodiment, the third side member 1310 may be disposed on the other side of the first side member 550 and may be movable toward the other side of the first side member 550. For example, the third side member 1310 may be movable toward the other side of the first side member 550 up to a third width W3 (e.g., the third width W3 in FIG. 3).

According to an embodiment, the second side member 560 may include substantially the same components as the side member 560 illustrated in FIG. 11 or FIG. 12, and the third side member 1310 may include substantially the same components as the second side member 560 and may be arranged to be symmetrical to the second side member 560. For example, the third side member 1310 may be disposed outside the first side member 550 and may include a second sliding cover surface 1325 facing the first antenna ANT #1 or the third antenna ANT #3. The second sliding cover 1325 may have a fourth outer segment 1361 disposed thereon to face the second inner segment 553 (e.g., the second inner segment 453 in FIG. 4B) while the electronic device 1300 is in the "reduced display (e.g., the display 310 in FIG. 3) state". For example, the fourth outer segment 1361 may be arranged to be symmetrical to the first outer segment 561 of the second side member 560.

According to an embodiment, while the electronic device 1300 is in the "expanded display 310 state", the second sliding cover surface 1325 may not face the second inner segment 553. For example, the second sliding cover surface 1325 may not face the second inner segment 553 while the second side member 560 moves by the third width W3. According to an embodiment, as the second sliding cover surface 1325 moves, the second inner segment 551 may be exposed to the outside (1301).

According to an embodiment, the third side member 1310 may include a bent surface 1324 bent at one side of the second sliding cover surface 1325, and a fifth outer segment 1363 may be disposed on the bent surface 1324. According to an embodiment, a fifth conductive portion 1362 may be disposed between the fourth outer segment 1361 and the fifth outer segment 1363, and the fifth conductive portion 1362 may be electrically connected to a ground of a printed circuit board (e.g., the printed circuit board 541 in FIG. 5). For example, a portion of the fifth conductive portion 1362 may be connected to the ground of the printed circuit board 541 via a hinge shaft (not illustrated) disposed inside the third side member 1310.

Figure 14:
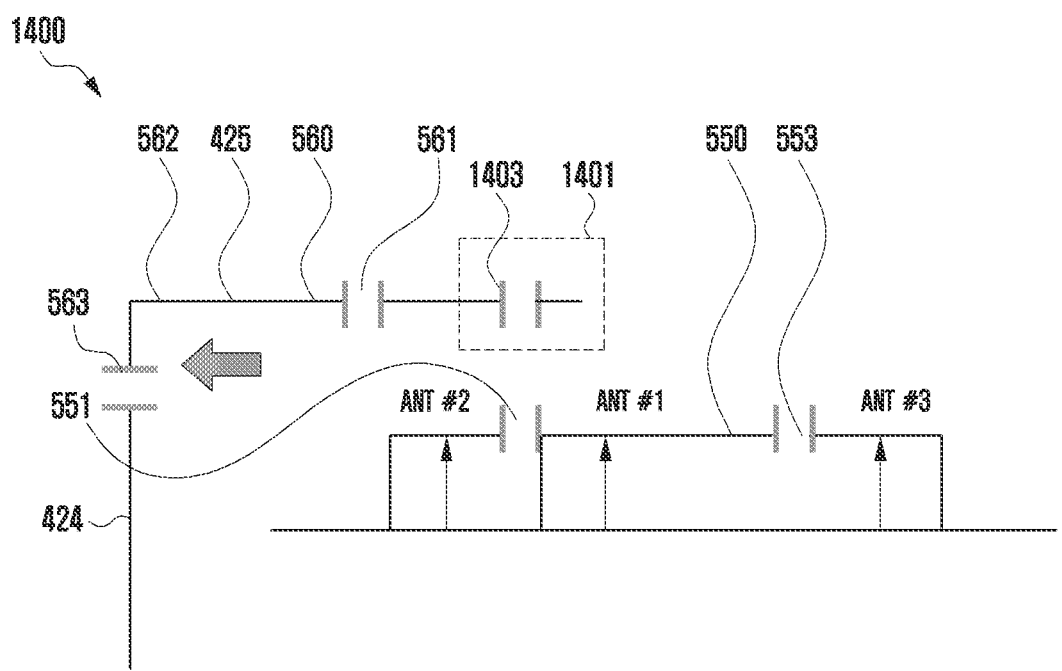
FIG. 14 is an equivalent circuit diagram obtained by modeling antenna portions of an electronic device according to another embodiment in which the length of a sliding cover surface is extended.

FIG. 14 is an equivalent circuit diagram obtained by modeling antenna portions of an electronic device according to another embodiment in which the length of a sliding cover surface is extended. For example, FIG. 14 may be an equivalent circuit diagram obtained by modeling antenna portions while the electronic device is in the "expanded display state". Except for the components described below, the electronic device 1400 shown in FIG. 14 may be substantially the same as or similar to the electronic device 500 shown in FIG. 12. In FIG. 14, the components substantially the same as those of the electronic device 500 illustrated in FIG. 12 are denoted by the same reference numerals, and as the descriptions of the components denoted by the same reference numerals as FIG. 12, the descriptions of the components described above with respect to FIG. 12 shall apply mutatis mutandis.

Referring to FIG. 14, in an electronic device 1400 (e.g., the electronic device 200 in FIG. 2) according to another embodiment of the disclosure, the sliding cover surface 425 of the second side member 560 (e.g., the sliding cover 425 of the second side member 560 in FIG. 5) may have a length that may be extended (1401) so as to face the first inner segment 553 of the first side member 550 even in the "expanded display (e.g., the display 510 in FIG. 5) state". For example, the length of the sliding cover surface 425 illustrated in FIG. 14 may be longer than the length of the sliding cover surface 425 illustrated in FIG. 12.

According to an embodiment, the sliding cover surface 425 may have a first outer segment 561 disposed on a portion facing the first inner segment 551 while the second side member 560 does not move from the first side member 550, and may have a sixth outer segment 1403 disposed on a portion facing the first inner segment 551 while the second side member 560 is maximally distant (e.g., by the second width W2 in FIG. 2) from the first side member 550.

Figure 15:
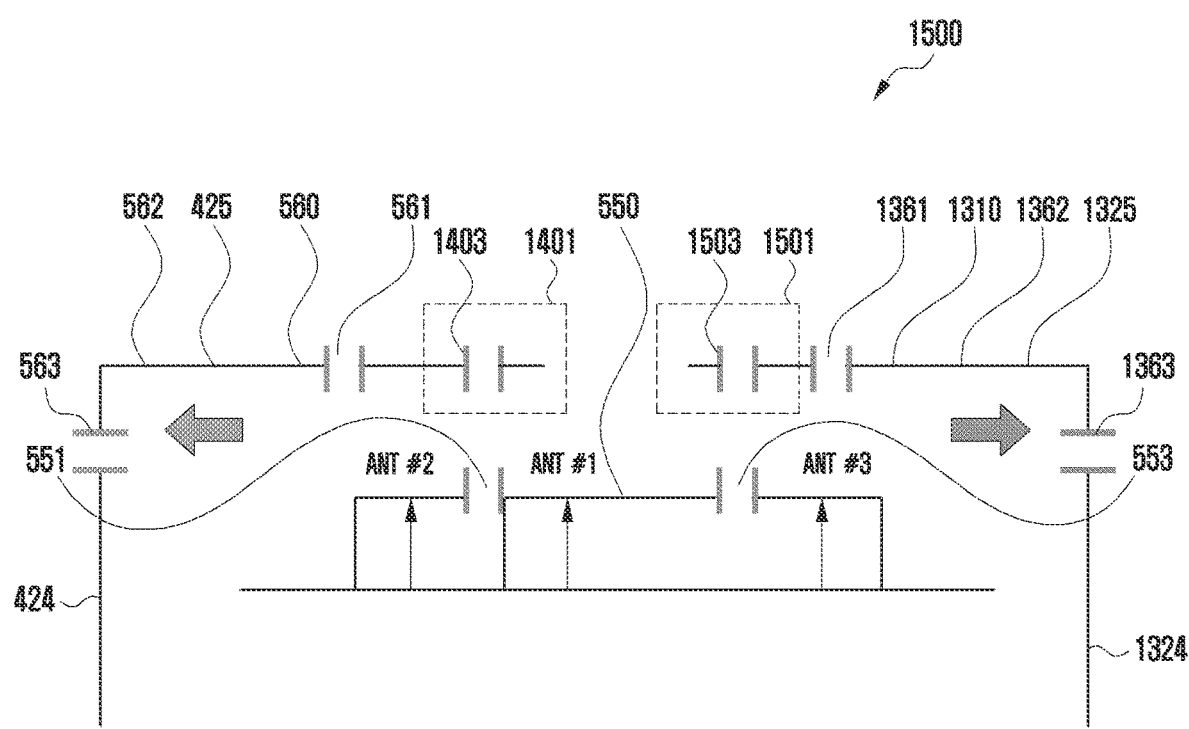
FIG. 15 is an equivalent circuit diagram obtained by modeling antenna portions of an electronic device according to another embodiment further including a third side member, the length of which is extended.

FIG. 15 is an equivalent circuit diagram obtained by modeling antenna portions of an electronic device according to another embodiment further including a third side member, the length of which is extended. For example, FIG. 15 may be an equivalent circuit diagram obtained by modeling antenna portions while the electronic device is in the "expanded display state". Except for the components described below, the electronic device 1500 illustrated in FIG. 15 may be substantially the same as or similar to the electronic device 1300 or 1400 illustrated in FIG. 13 or FIG. 14. In FIG. 15, the components substantially the same as those of the electronic device 1300 or 1400 illustrated in FIG. 13 or FIG. 14 are denoted by the same reference numerals, and as the descriptions of the components denoted by the same reference numerals as FIG. 13 or FIG. 14, the descriptions of the components described above with respect to FIG. 13 or FIG. 14 shall apply mutatis mutandis.

Referring to FIG. 15, the electronic device 1500 (e.g., the electronic device 300 in FIG. 3) according to another embodiment of the disclosure may include a first side member 550 (e.g., the first side member 500 in FIG. 5), a second side member 560 (e.g., the second side member 560 in FIG. 5), and a third side member 1510 (e.g., the third side member 325 in FIG. 3).

According to an embodiment, the second side member 560 may be disposed on one side of the first side member 550 and may be movable toward the one side of the first side member 550. For example, the second side member 560 may move toward the one side of the first side member 550 up to a second width W2 (e.g., the second width W2 in FIG. 3).

According to an embodiment, the third side member 1510 may be disposed on the other side of the first side member 550 and may be movable toward the other side of the first side member 550. For example, the third side member 1510 may be movable toward the other side of the first side member 550 up to a third width W3 (e.g., the third width W3 in FIG. 3).

According to an embodiment, the second side member 560 may include substantially the same components as the side member 560 illustrated in FIG. 14, and the third side member 1510 may include substantially the same components as the second side member 560 and may be arranged to be symmetrical to the second side member 560. For example, the third side member 1510 may be disposed outside the first side member 550 and may include a second sliding cover surface 1325 facing the first antenna ANT #1 or the third antenna ANT #3. The second sliding cover 1325 may have a fourth outer segment 1361 disposed thereon to face the second inner segment 553 (e.g., the second inner segment 453 in FIG. 4B) while the electronic device 1500 is in the "reduced display (e.g., the display 310 in FIG. 3) state". According to an embodiment, the length of the second sliding cover surface 1325 may be extended (1501) while the third side member 1510 is maximally distant from the first side member 550 (e.g., the third width W3 in FIG. 3), and a seventh outer segment 1503 may be disposed on the portion facing the second inner segment 553 when the length is extended (1501).

Figure 16:
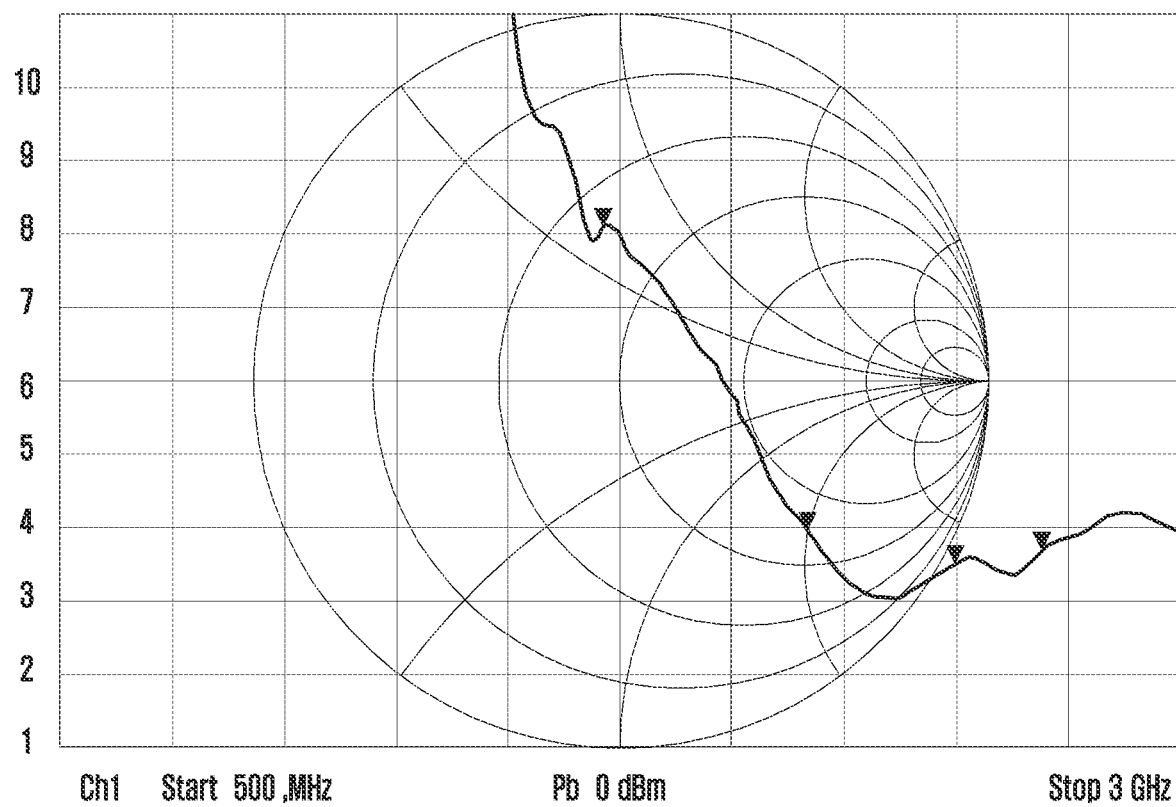
FIG. 16 is a graph representing a voltage standing wave ratio (VSWR) measured through a first antenna ANT #1 while an electronic device according to an embodiment of the disclosure is in the "reduced display state"
Figure 17:
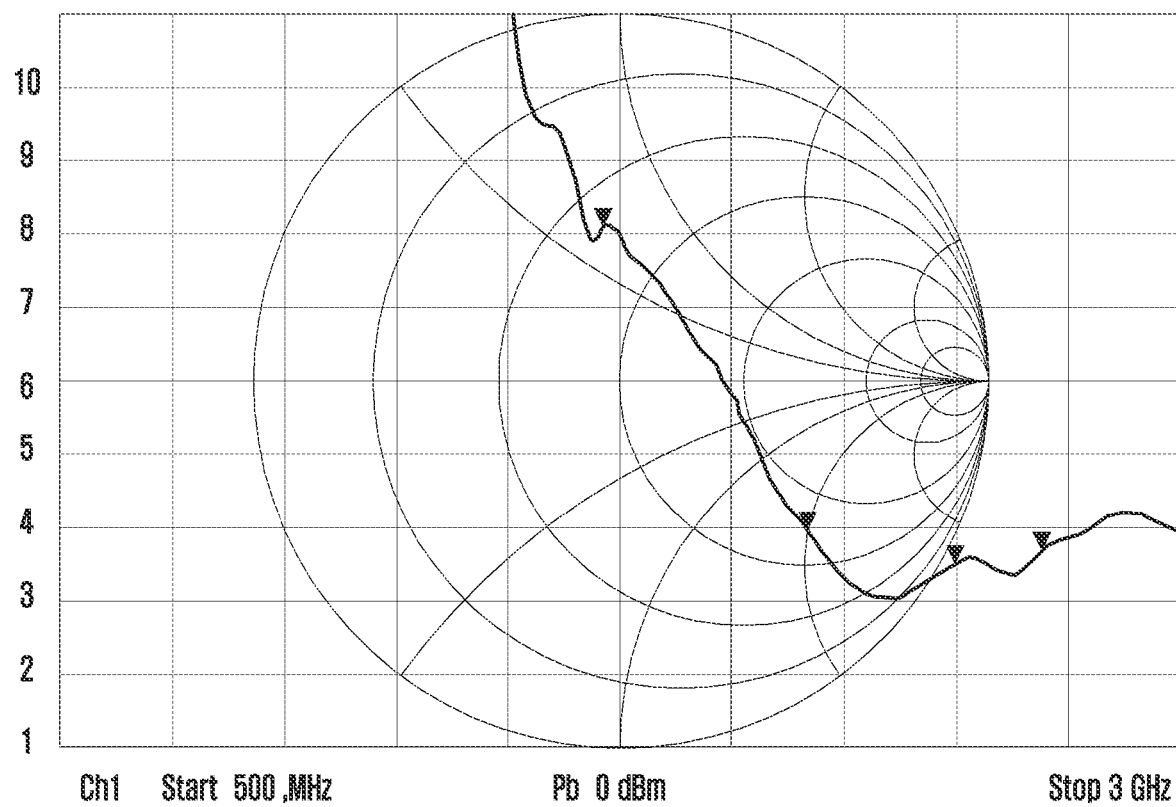
FIG. 17 is a graph representing a voltage standing wave ratio (VSWR) measured through a first antenna ANT #1 while an electronic device according to an embodiment of the disclosure is in the "expanded display state"

FIG. 16 is a graph representing a voltage standing wave ratio (VSWR) measured through a first antenna ANT #1 while an electronic device according to an embodiment of the disclosure is in the "reduced display state". FIG. 17 is a graph representing a voltage standing wave ratio (VSWR) measured through a first antenna ANT #1 while an electronic device according to an embodiment of the disclosure is in the "expanded display state".

Referring to FIGS. 16 and 17, results obtained by measuring a voltage standing wave ratio (VSWR) for an electronic device 500 (e.g., the electronic device 500 in FIG. 5) according to various embodiments of the disclosure are represented. It can be seen that a change in characteristics of the first antenna ANT #1 or a change in frequency resonance measured in the "expanded display (e.g., the display 510 of FIG. 5) state" and in the "reduced display 510 state" is not large. For example, since the first antenna ANT #1 is longer than the second antenna ANT #2 and the third antenna ANT #3, the characteristics may be sensitively changed according to the change in a surrounding metal or a ground. However, in the electronic device 500 according to various embodiments of the disclosure, it can be found that the change in characteristics of the first antenna ANT #1 or a change in frequency resonance is not large regardless of the sliding movement of the second side member (e.g., the second side member 560 in FIG. 5). It can be seen from the test results illustrated in FIGS. 16 and 17 that the reliability of the antenna is increased in the electronic device according to various embodiments of the disclosure.

Figure 18A:
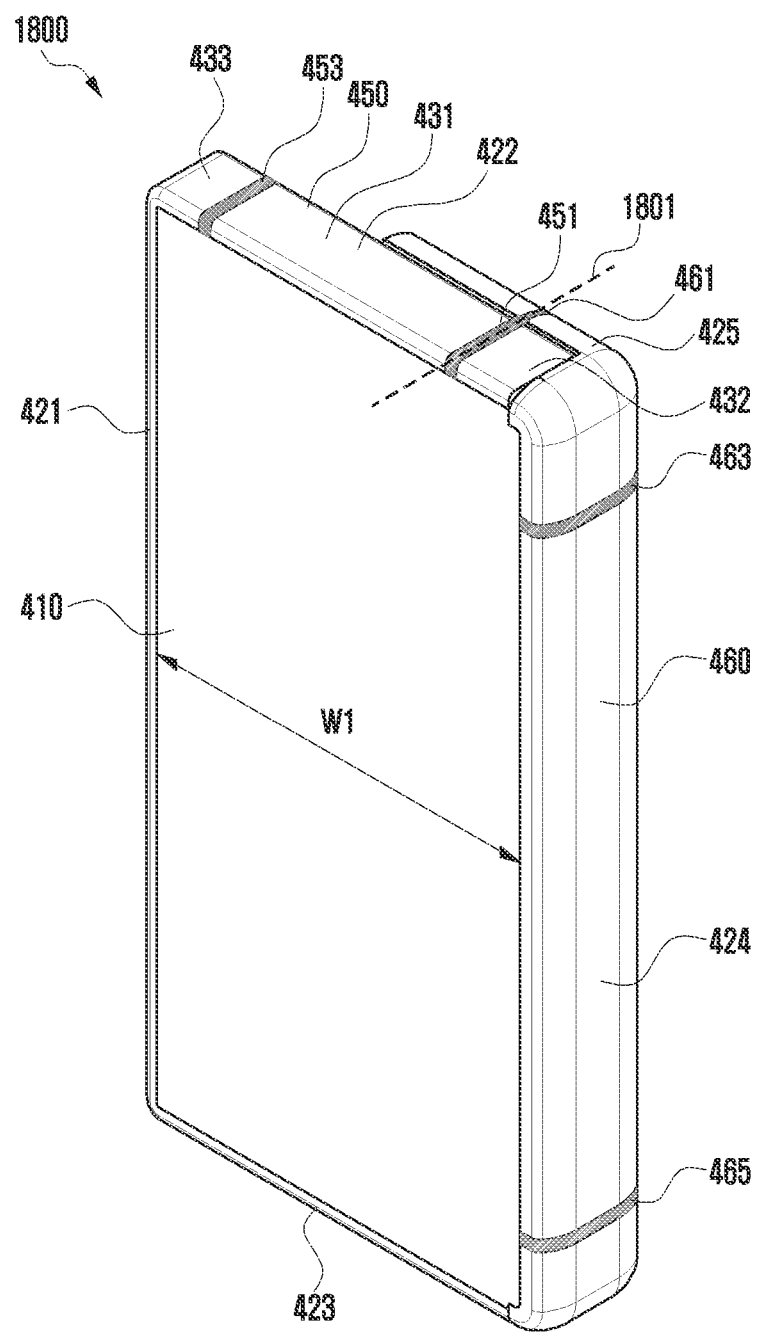
FIGS. 18A and 18B are perspective views illustrating an electronic device according to another embodiment of the disclosure.
Figure 18B:
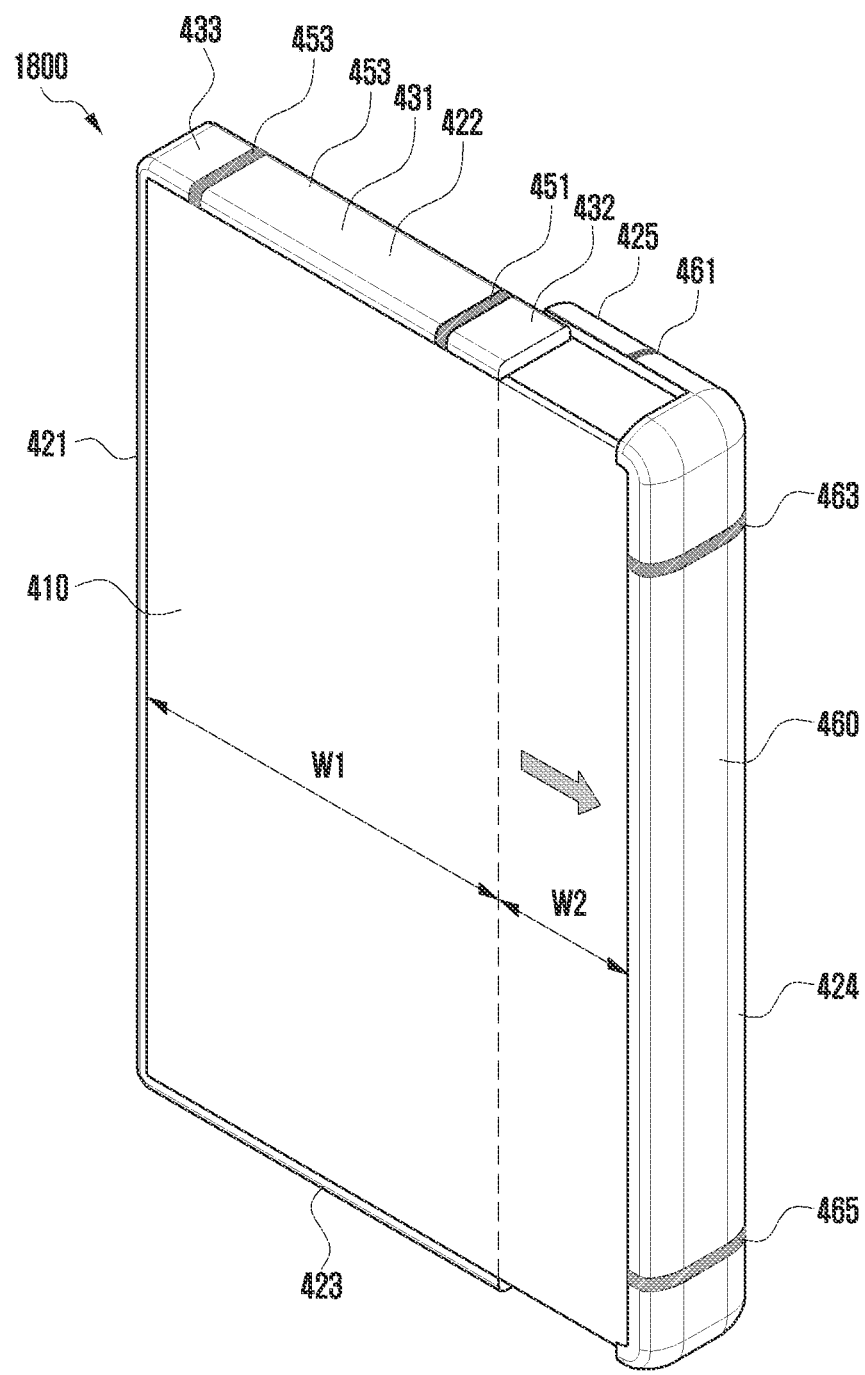

FIGS. 18A and 18B are perspective views illustrating an electronic device according to another embodiment of the disclosure. For example, FIG. 18A is a perspective view illustrating the case in which an electronic device according to another embodiment of the disclosure is in the "reduced display state", and FIG. 18B is a perspective view illustrating the case in which an electronic device according to another embodiment of the disclosure is in the "expanded display state". Except for the components described below, the electronic device 1800 illustrated in FIG. 18 may be substantially the same as or similar to the electronic device 400 illustrated in FIGS. 4A and 4B. In FIG. 18, the components substantially the same as those of the electronic device 400 illustrated in FIGS. 4A and 4B are denoted by the same reference numerals, and as the descriptions of the components denoted by the same reference numerals as FIGS. 4A and 4B, the descriptions of the components described above with respect to FIGS. 4A and 4B shall apply mutatis mutandis.

Referring to FIGS. 18A and 18B, unlike the electronic device 400 illustrated in FIGS. 4A and 4B, in the electronic device 1800 (e.g., the electronic device 200 in FIG. 2) according to another embodiment of the disclosure, the fifth surface (e.g., the fifth surface 425 in FIG. 4A) of the second side member (e.g., the second side member 460 in FIG. 4A) may not face the second surface (e.g., the second surface 422 in FIG. 4A) of the first side member (e.g., the first side member 460 in FIG. 4A), and the second surface 422 may be exposed to the outside. For example, the fifth surface 425 of the second side member 460 may be disposed adjacent to the boundary of the second side 422 when viewed from above the second surface 422, and may be disposed on a second direction (e.g., the rear surface) of the second surface 422.

According to an embodiment, the first inner segment 451 and the second inner segment 453 disposed on the second surface 422 of the first side member 450 may be exposed to the outside regardless of the movement of the second side member 460.

According to an embodiment, a first outer segment 461 may be disposed on the fifth surface 425 of the second side member 460. For example, the first outer segment 461 may be disposed in the straight line 1801 with the first inner segment 451 when viewed from above the second surface 422 while the second side member 460 is not moving from the first side member 450.

According to an embodiment, the fifth surface 425 of the second side member 460 may not be located adjacent to the first inner segment 451 when viewed from above the second surface 422 while the display 1810 (e.g., the display 410 in FIG. 4) is in the expanded state.

According to another embodiment, although not illustrated, the electronic device 1800 may include substantially the same components as the second side member 460, and may further include a third side member (e.g., the third side member 325 in FIG. 3) arranged to be symmetrical to the second side member 460.

Figure 19:
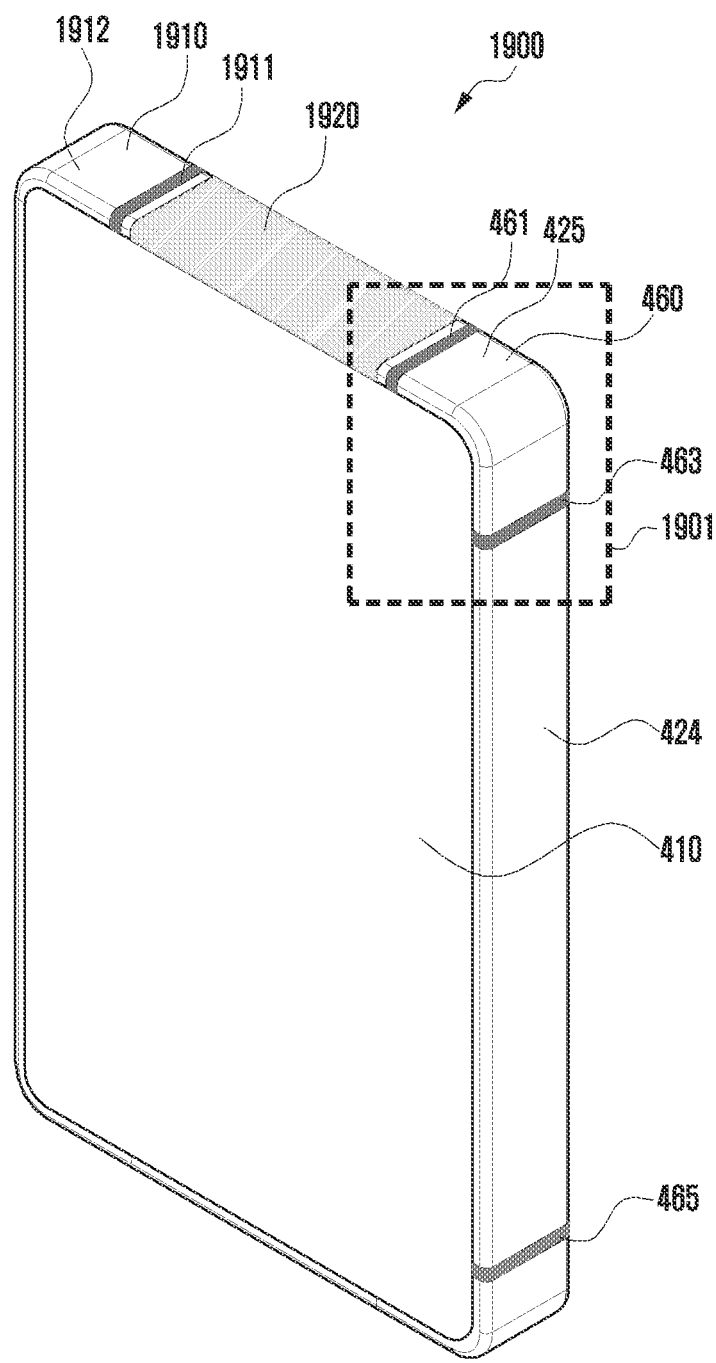
FIG. 19 is a perspective view illustrating an electronic device according to another embodiment of the disclosure.
Figure 20A:
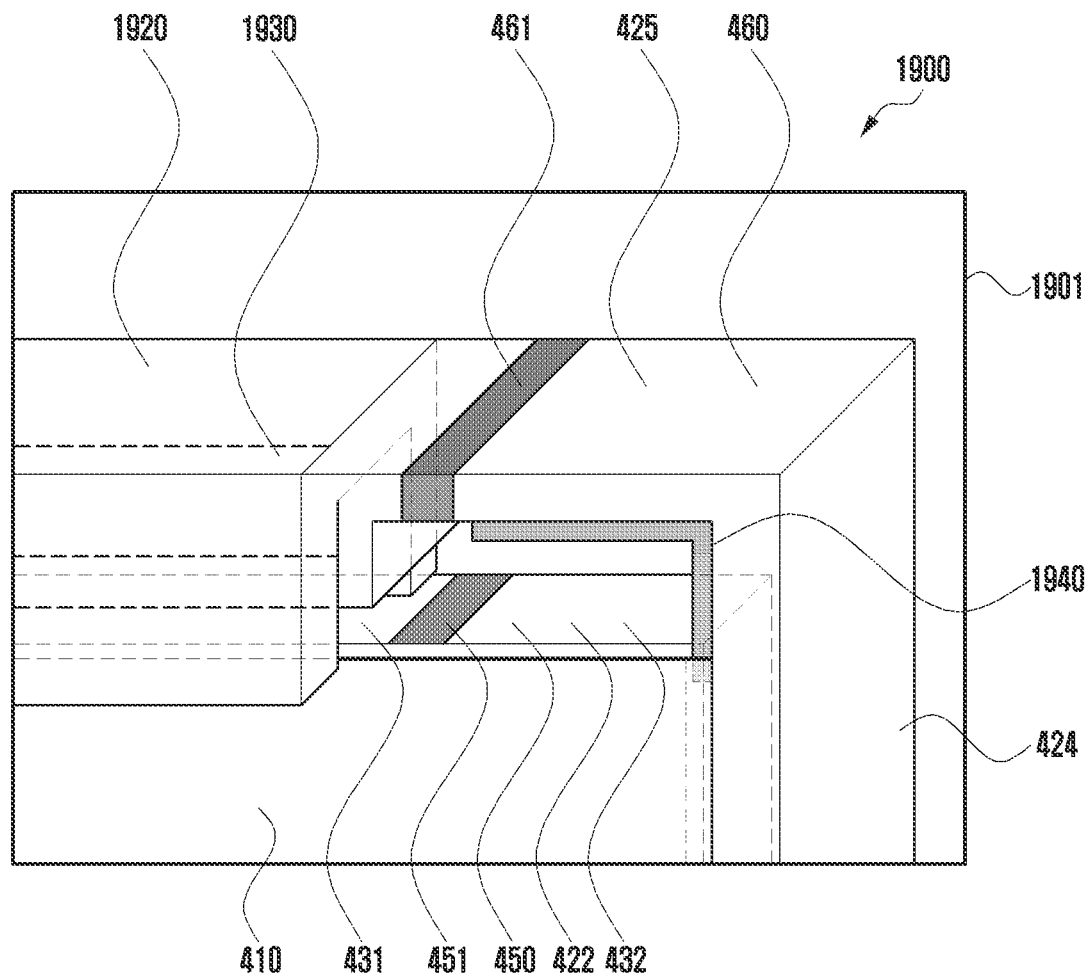
FIGS. 20A to 20C are perspective views illustrating a sliding movement of a second side member while an electronic device according to another embodiment of the disclosure is switched from the "reduced display state" to the "expanded display state"
Figure 20B:
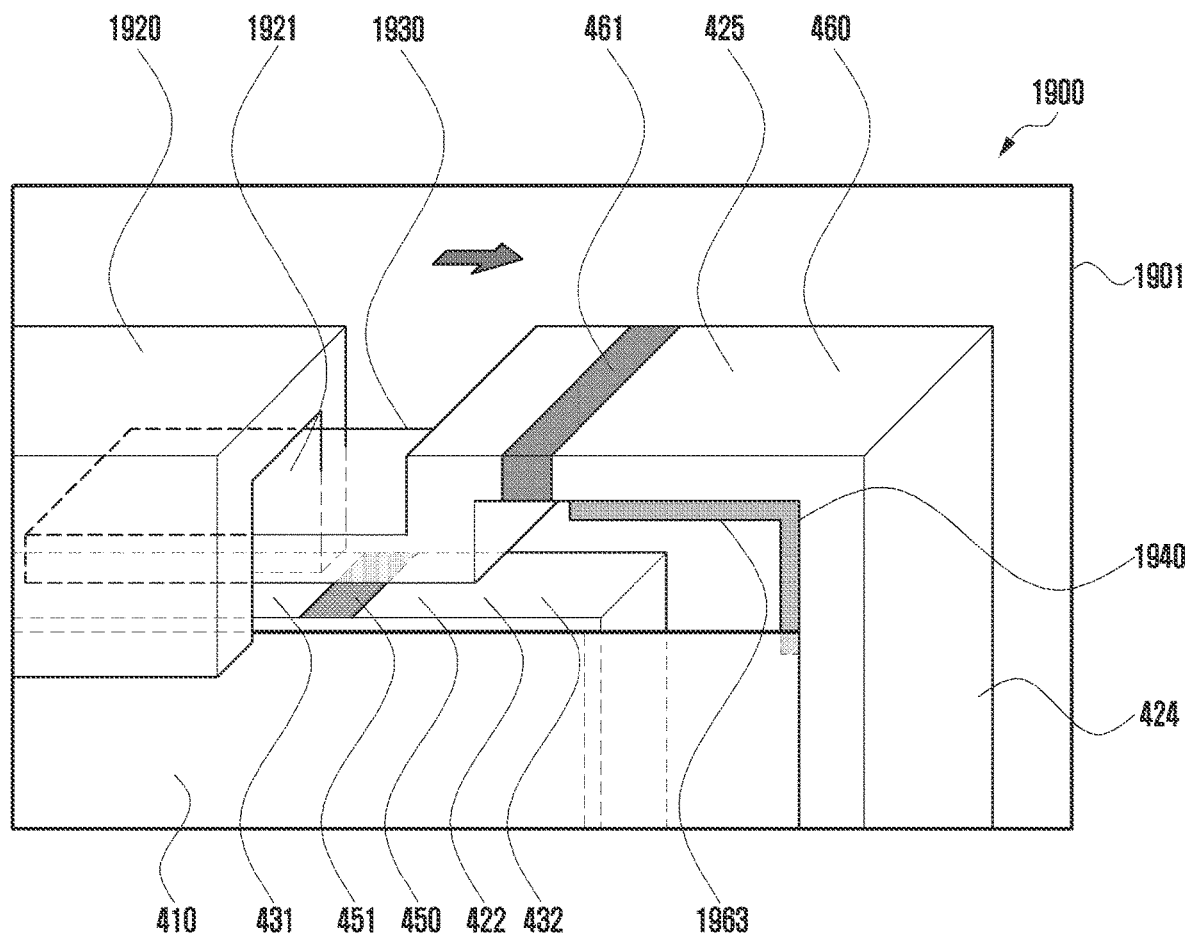
Figure 20C:
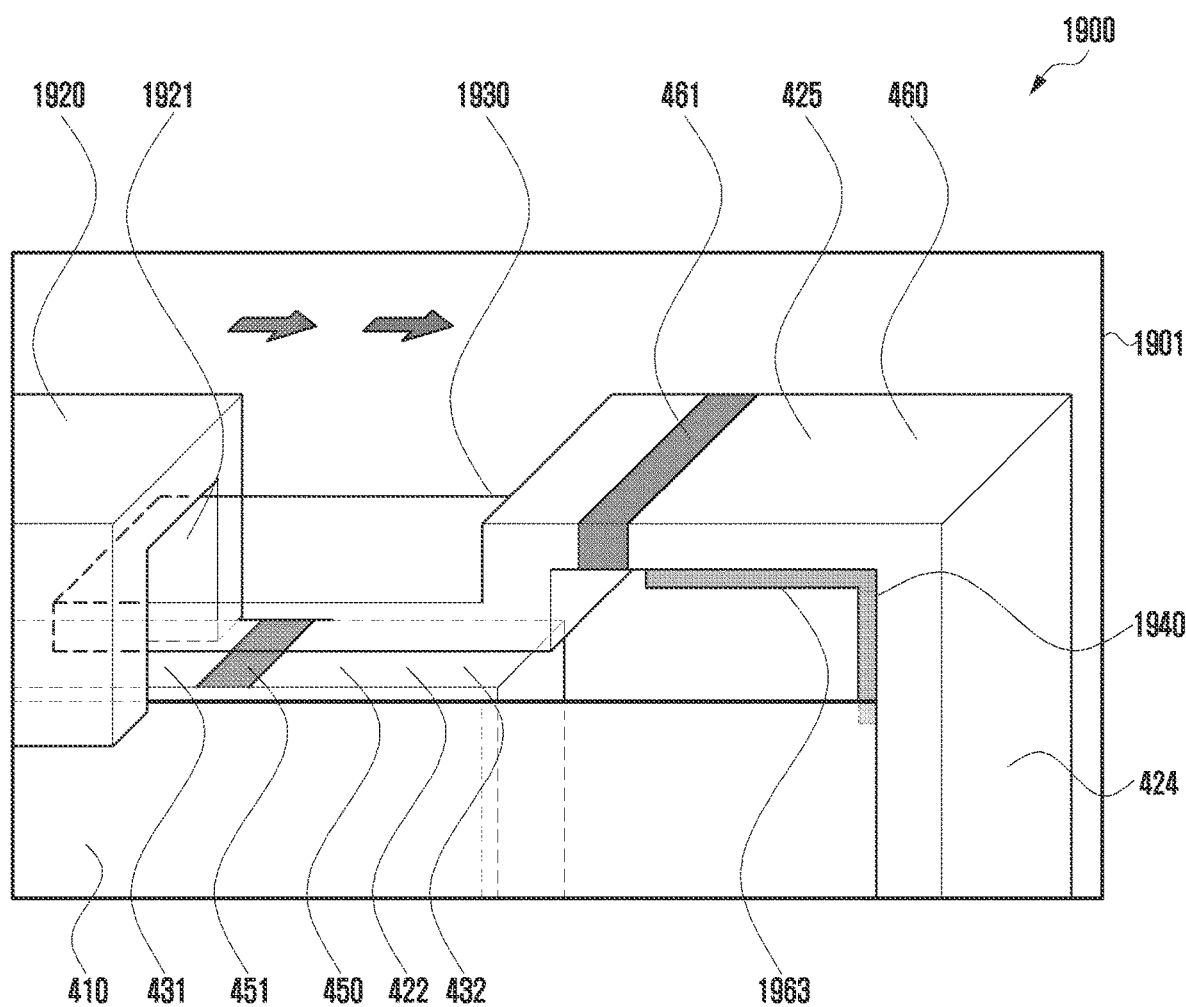

FIG. 19 is a perspective view illustrating an electronic device according to another embodiment of the disclosure. FIGS. 20A to 20C are perspective views illustrating a sliding movement of a second side member while an electronic device according to another embodiment of the disclosure is switched from the "reduced display state" to the "expanded display state". For example, FIGS. 20A to 20C may be perspective views illustrating a corner portion 1901 of the electronic device illustrated in FIG. 19. Except for the components described below, the electronic device 1900 illustrated in FIG. 19 and FIGS. 20A to 20C may be substantially the same as or similar to the electronic device 400 illustrated in FIGS. 4A and 4B. In FIG. 19 and FIGS. 20A to 20C, the components substantially the same as those of the electronic device 400 illustrated in FIGS. 4A and 4B are denoted by the same reference numerals, and as the descriptions of the components denoted by the same reference numerals as FIGS. 4A and 4B, the descriptions of the components described above with respect to FIGS. 4A and 4B shall apply mutatis mutandis.

Referring to FIG. 19 and FIGS. 20A to 20C, unlike the electronic device 400 illustrated in FIGS. 4A and 4B, an electronic device 2100 (e.g., the electronic device 300 in FIG. 3) according to another embodiment of the disclosure may include a fixed cover 1920 fixed outside the first side member (e.g., the first side member 450 in FIG. 4A) and disposed to face the second surface (e.g., the second surface 422 in FIG. 4A) of the first side member 450. For example, the fixed cover 1920 may be disposed to face the first conductive portion (e.g., the first conductive portion 431 in FIG. 4A) of the first side member 450. According to an embodiment, the fixed cover 1920 may be formed of a conductive material or a non-conductive material. For example, at least a portion of the fixed cover 1920 may be made of a metal material, and at least a portion of the remaining part may be formed of an injection-molded product.

According to an embodiment, the second side member (e.g., the second side member 460 in FIG. 4A) may be coupled to one side of the fixed cover 1920 in a sliding manner. For example, the second side member 460 may include a stepped portion 1930, and the stepped portion 1930 of the second side member 460 may be inserted into a space 1921 between the fixed cover 1920 and the first side member 450 during the "reduced display (e.g., the display 410 in FIG. 4A) state".

According to an embodiment, on the sliding cover surface 425 of the second side member 460, for example, the inner surface of the fifth surface 425 (e.g., the fifth surface 425 in FIG. 4A), an insulating member 1940 facing the first side member 450 may be disposed. According to an embodiment, the insulating member 1940 may be for forming multiple resonances by adjusting the parasitic capacitance generated between an antenna (e.g., the first antenna ANT #1 or the second antenna ANT #2 in FIG. 11) and the second side member 460 by the conductive portion of the first side member 450, for example, a first conductive portion (e.g., the first conductive portion 431 or the second conductive portion 432 in FIG. 4B). For example, the insulating member 1940 may be an insulating tape.

According to an embodiment, although not illustrated, the electronic device 1900 may include substantially the same components as the second side member 460, and may further include a third side member (e.g., the third side member 325 in FIG. 3) arranged to be symmetrical to the second side member 460. For example, the third side member 325 may be coupled to the other side of the fixed cover 1920 in a sliding manner, and may include a second stepped portion (not illustrated) inserted into a space 1921 between the fixed cover 1920 and the first side member 450 during the "reduced display 410 state".

Figure 21:
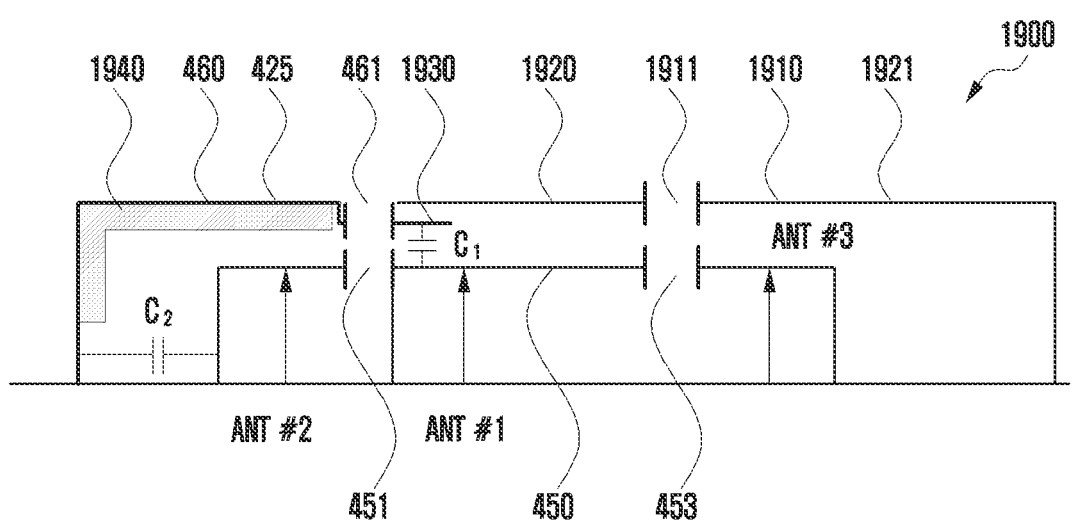
FIG. 21 is an equivalent circuit diagram obtained by modeling antenna portions while an electronic device according to another embodiment of the disclosure is in the "reduced display state"
Figure 22:
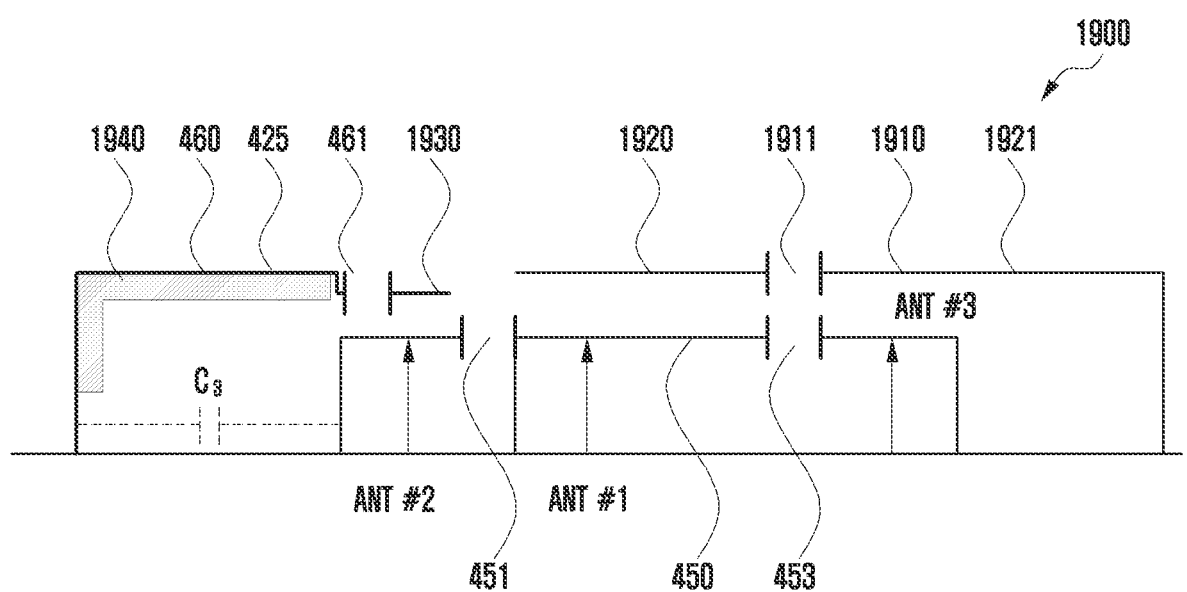
FIG. 22 is an equivalent circuit diagram obtained by modeling antenna portions while an electronic device according to another embodiment of the disclosure is in the "expanded display state"

FIG. 21 is an equivalent circuit diagram obtained by modeling antenna portions while an electronic device according to another embodiment of the disclosure is in the "reduced display state". FIG. 22 is an equivalent circuit diagram obtained by modeling antenna portions while an electronic device according to another embodiment of the disclosure is in the "expanded display state". For example, FIG. 21 may be a diagram obtained by modeling the antenna portions of the electronic device 1900 illustrated in FIG. 20A, and FIG. 22 may be a diagram obtained by modeling the antenna portions of the electronic device 1900 illustrated in FIG. 20C.

Referring to FIGS. 21 and 22, an electronic device (e.g., the electronic device 1900 in FIG. 19) according to another embodiment of the disclosure may include multiple antennas, which are formed of a metal constituting a portion of the first side member 450 (e.g., the first side member 450 in FIG. 4A). The multiple antennas may include a first antenna ANT #1 for resonating a first RF signal, a second antenna ANT #2 for resonating a second RF signal, and a third antenna ANT #3 for resonating the second RF signal. For example, the first antenna ANT #1 may be disposed between the second antenna ANT #2 and the third antenna ANT #3 and may have a relatively large length.

According to an embodiment, a first inner segment 451 (e.g., the first inner segment 451 in FIG. 4B) may be disposed between the first antenna ANT #1 and the second antenna ANT #2, and a second inner segment 453 (e.g., the second inner segment 453 in FIG. 4B) may be disposed between the first antenna ANT #1 and the third antenna ANT #3.

According to an embodiment, outside the first side member 450, the second side member 460, the fixed member 1920, and the third side member 1910 may be disposed. According to an embodiment, the second side member 460 may be disposed to face the first antenna ANT #1 or the second antenna ANT #2, the fixed member 1920 may be disposed to face the first antenna ANT #1, and the third side member may be disposed to face the first antenna ANT #1 or the third antenna ANT #3.

According to an embodiment, the second side member 460 (e.g., the second side member 460 in FIG. 4B) may include a sliding cover surface 425 (e.g., the fifth surface 425 in FIG. 4B) facing the first antenna ANT #1 or the second antenna ANT #2.

Referring to FIG. 21, the sliding cover surface 425 may have a first outer segment 461 (e.g., the first outer segment 461 in FIG. 4) disposed thereon to face the first inner segment 451 while the electronic device 1900 is in the "reduced display (e.g., the display 410 in FIG. 4A) state".

Referring to FIG. 22, the sliding cover surface 425 according to an embodiment may not face the first inner segment 451 while the electronic device 1900 is in the "expanded display 410 state". For example, the sliding cover surface 425 may not face the first inner segment 451 while the second side member 460 moves by a second width (e.g., the second width W2 in FIG. 3). According to an embodiment, as the sliding cover surface 425 moves, the first inner segment 451 may be exposed to the outside.

According to an embodiment, the sliding cover surface 425 may include a stepped portion 1930, and the stepped portion 1930 may be inserted into the space between the fixed member 1920 and the first antenna ANT #1 while the electronic device 1900 is in the "reduced display (e.g., the display 410 in FIG. 4A) state" and may generate a first parasitic capacitance C1.

According to an embodiment, on the sliding cover surface 425 of the second side member 460, for example, the inner surface of the fifth surface 425 (e.g., the fifth surface 425 in FIG. 4A), an insulating member 1940 facing the first side member 450 may be disposed. According to an embodiment, the insulating member 1940 may be for forming multiple resonances by adjusting a parasitic capacitance between an antenna disposed on the first side member 450, for example, the second antenna ANT #2, and the second side member 460. For example, while the electronic device 1900 is in the "reduced display (e.g., the display 410 of FIG. 4A) state", a first parasitic C1 may be formed between the first antenna ANT #1 and the second side member 460, and a second parasitic capacitance C2 may be formed between the second antenna ANT #2 and the second side member 460 by the insulating member 1940. As another example, while the electronic device 1900 is in the "expanded display (e.g., the display 410 in FIG. 4A) state", a third parasitic capacitance C3 different from the second parasitic capacitance C2 may be formed between the second antenna ANT #2 and the second side member 2160 by the insulating member 1940. Since the insulating member 1940 is disposed on the second side member 1940, it is possible to design the electronic device 1900 according to an embodiment such that the parasitic capacitance between the antenna disposed on the first side member 450 and the second side member 460 can be adjusted and multiple resonances can be generated from the first antenna ANT #1.

According to an embodiment, the fixed cover 1920 may be formed of a material that is the same as or different material from that of the first side member 450. For example, at least a portion of the fixed cover 1920 may be made of a metal material, and at least a portion of the remaining part may be formed of an injection-molded product.

According to an embodiment, the third side member 1910 may be fixedly coupled to the other side of the fixed cover 1920. According to an embodiment, the third side member 1910 may include a cover surface 1912 facing the second inner segment 453, and a fourth outer segment 1911 (e.g., the fourth outer segment 1361 in FIG. 13) facing the second inner segment 453 may be disposed on the cover surface 1912.

According to another embodiment, the third side member 1910 may be coupled to the other side of the fixing cover 1920 in a sliding manner, rather than being fixed. For example, although not illustrated, the third side member 1910 may include substantially the same components as the second side member 460 and may be arranged to be symmetrical to the second side member 460.

Figure 23:
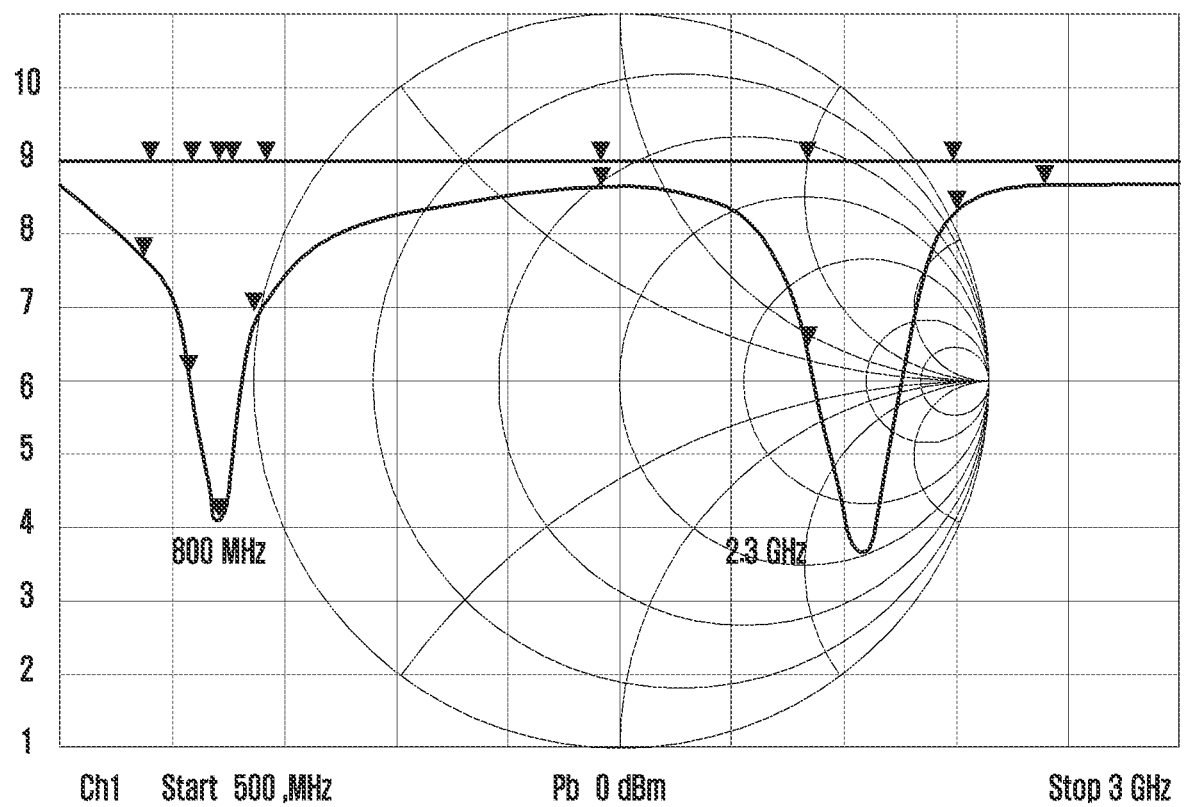
FIG. 23 is a graph representing a voltage standing wave ratio (VSWR) measured through a first antenna of an electronic device according to another embodiment of the disclosure.

FIG. 23 is a graph representing a voltage standing wave ratio (VSWR) measured through a first antenna of an electronic device according to another embodiment of the disclosure. For example, FIG. 23 may be a graph representing a VSWR measure through the first antenna ANT #1 of the electronic device 1900 illustrated in FIG. 21.

Referring to FIG. 23, it can be seen that in the electronic device 1900 (e.g., the electronic device 1900 in FIG. 21), by attaching an insulating member 1940 (e.g., the insulating member 1940 in FIG. 21) to the inner surface of the second side member 460 (e.g., the second side member 460 in FIG. 21), it is possible to adjust a parasitic capacitance between an antenna (e.g., the first antenna ANT #1 or the second antenna ANT #2 in FIG. 21) disposed on the first side member 450 (e.g., the first side member 450) and the second side member 460 and thus multiple resonances are generated from the first antenna ANT #1. For example, the frequency band resonated by the resonance of the first antenna ANT #1 was measured as a band of about 800 MHz and about 2.3 GHz, and thus it can be seen that the first antenna ANT #1 is capable of radiating a first RF signal having a communication frequency of a low or mid band (low band: ~1 GHz, mid band: ~2.1 GHz).

Figure 24:
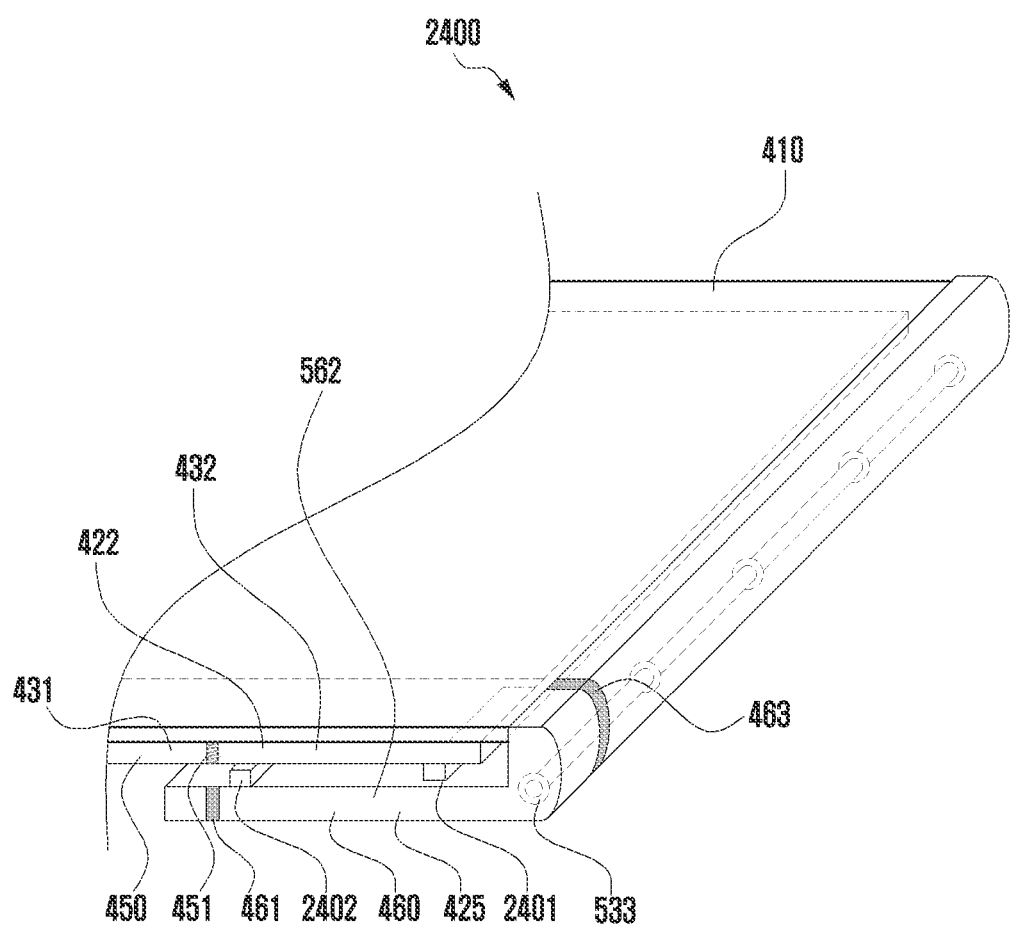
FIG. 24 is a perspective view illustrating the case in which an electronic device according to another embodiment of the disclosure is in the "reduced display state"
Figure 25:
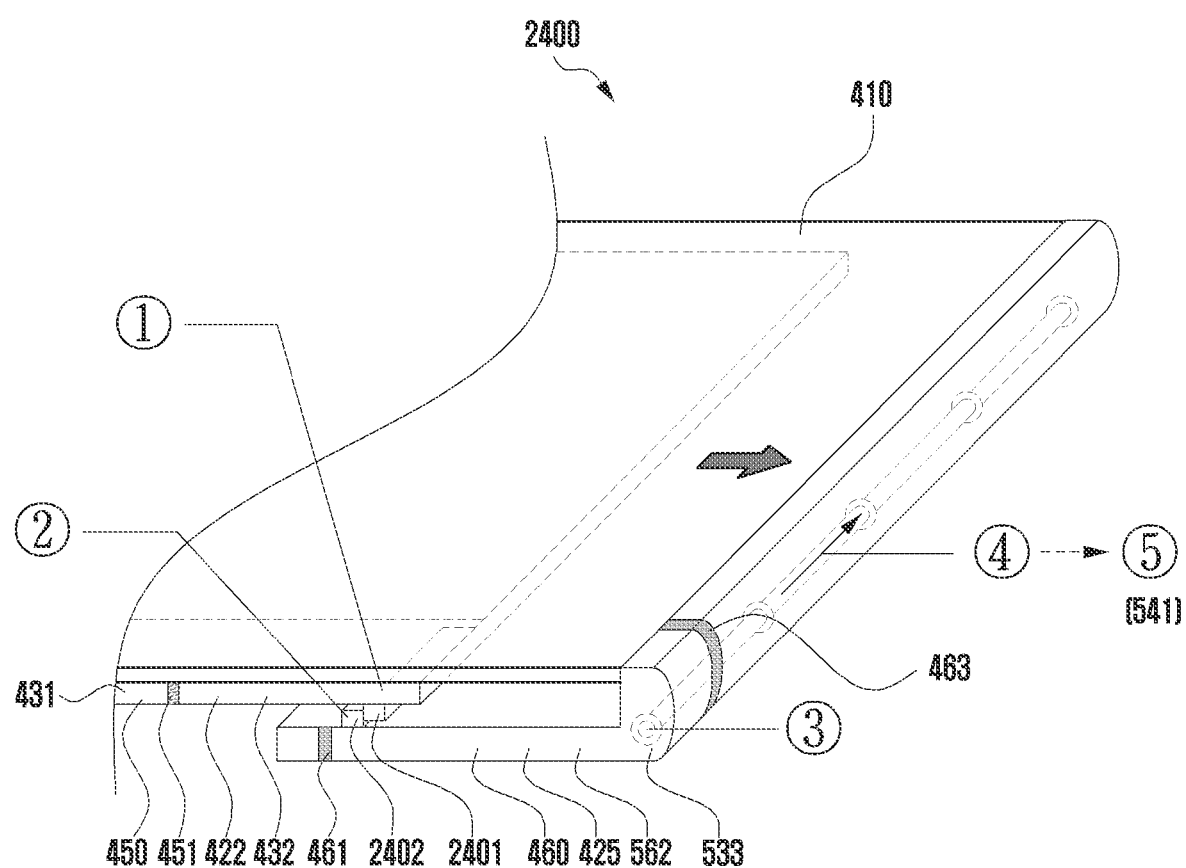
FIG. 25 is a perspective view illustrating the case in which an electronic device according to another embodiment of the disclosure is in the "expanded display state"

FIG. 24 is a perspective view illustrating the case in which an electronic device according to another embodiment of the disclosure is in the "reduced display state". FIG. 25 is a perspective view illustrating the case in which an electronic device according to another embodiment of the disclosure is in the "expanded display state".

Except for the components described below, the electronic device 2400 illustrated in FIGS. 24 and 25 may be substantially the same as or similar to the electronic device 1800 illustrated in FIGS. 18A and 18B. In FIGS. 24 and 25, the components substantially the same as those of the electronic device 1800 illustrated in FIGS. 18A and 18B are denoted by the same reference numerals, and as the descriptions of the components denoted by the same reference numerals as FIGS. 18A and 18B, the descriptions of the components described above with respect to FIGS. 18A and 18B shall apply mutatis mutandis.

Referring to FIGS. 24 and 25, unlike the electronic device 1800 illustrated in FIGS. 18A and 18B, an electronic device 2400 (e.g., the electronic device 1800 in FIG. 18A) according to another embodiment of the disclosure may include a first protrusion 2401 disposed on the first side member 450 (e.g., the first side member 450 in FIG. 4B) and a second protrusion 2402 disposed on the second side member 460 (e.g., the second side member 460 in FIG. 4B).

According to an embodiment, on the second surface 422 of the first side member, a first conductive portion 431 (e.g., the first conductive portion 431 in FIG. 4B), a second conductive portion 432 (e.g., the second conductive portion 432 in FIG. 4B), and a third conductive portion (not illustrated) (e.g., the third conductive portion 433 in FIG. 4B) may be disposed, and the second conductive portion 432 may include the first protrusion 2401. According to an embodiment, the first protrusion 2401 may protrude to a second direction (e.g., the rear surface).

According to an embodiment, on the fifth surface 425 (e.g., the fifth surface 425 in FIG. 4B) of the second side member 460, a first outer segment 461 (e.g., the first outer segment in FIG. 18A), a fourth conductive portion 562 (e.g., the fourth conductive portion 562 in FIG. 11) adjacent to the segment 461 may be disposed, and the fourth conductive portion 562 may include a second protrusion 2402. According to an embodiment, the second protrusion 2402 may protrude to a first direction (e.g., the front surface).

According to an embodiment, during the "expanded display (e.g., the display 410 in FIG. 4A) state", the second protrusion 2402 may be in contact with the first protrusion 2401 so as to form an electrical path between the second conductive portion 432 and the fourth conductive portion 562.

According to an embodiment, the fourth conductive portion 562 may be electrically connected to a ground of a printed circuit board (e.g., the printed circuit board 541 in FIG. 5). For example, a portion of the fourth conductive portion 562 may be connected to the ground of the printed circuit board 541 via a hinge shaft 533 (e.g., the hinge shaft 533 in FIG. 5) disposed inside the second side member 460.

While the electronic device 2400 according to an embodiment is in the "expanded display (e.g., the display 4A in FIG. 4A) state", the second protrusion 2402 may be in contact with the first protrusion 2401 so as to form an electrical path between the second conductive portion 432 and the fourth conductive portion 562, thereby forming a ground path (①, ②, ③, ④, ④) from the first protrusion 2401 to the printed circuit board 541.

Figure 26:
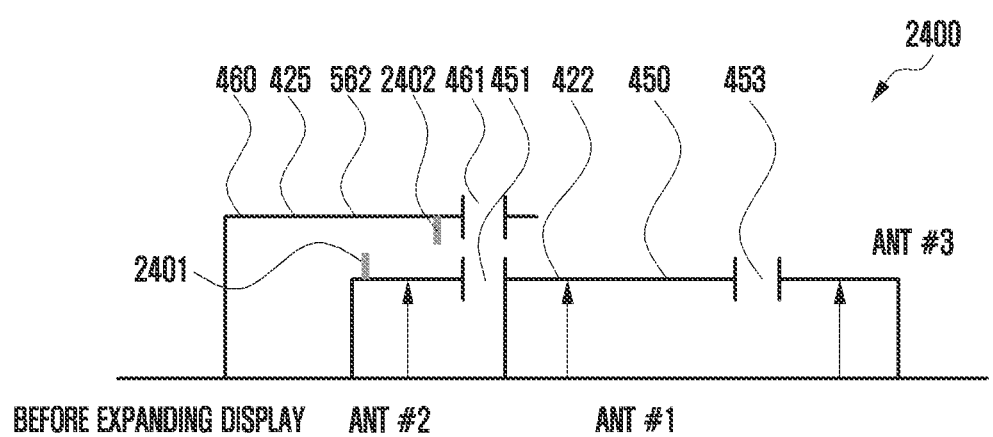
FIG. 26 is an equivalent circuit diagram obtained by modeling the antenna portions of the electronic device illustrated in FIG. 24.
Figure 27:
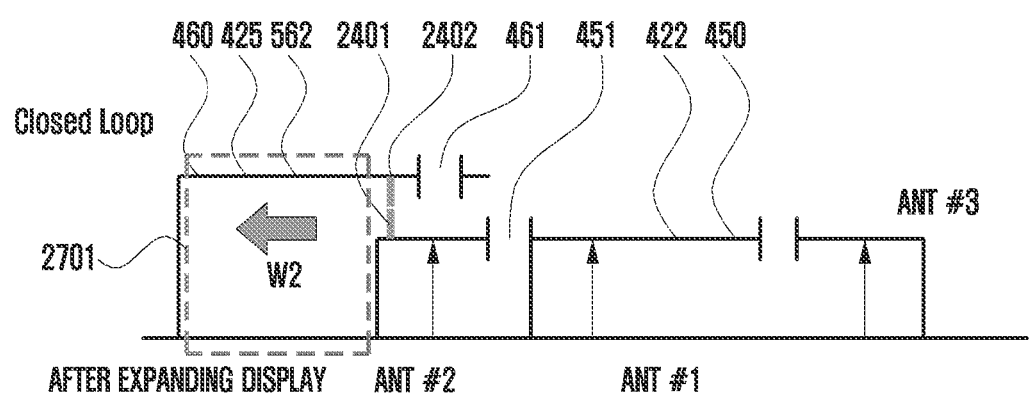
FIG. 27 is an equivalent circuit diagram obtained by modeling the antenna portions of the electronic device illustrated in FIG. 25.

FIG. 26 is an equivalent circuit diagram obtained by modeling antenna portions of the electronic device illustrated in FIG. 24. FIG. 27 is an equivalent circuit diagram obtained by modeling antenna portions of the electronic device illustrated in FIG. 25.

Referring to FIGS. 26 and 27, while the electronic device 2400 (e.g., the electronic device 2400 in FIG. 24) according to an embodiment is in the "expanded display (e.g., the display 410 in FIG. 4A) state", the first protrusion 2401 of the first side member 450 may be connected to the second protrusion 2402 of the second side member 460, thereby forming a ground path arriving at a printed circuit board (e.g., the printed circuit board 541 in FIG. 5) from the first protrusion 2401 so that a loop-shaped antenna 2701 can be implemented. The electronic device 2400 according to an embodiment may adjust the length of the loop-shaped antenna 2701 by adjusting the positions of the first protrusion 2401 or the second protrusion 2402. When the electronic device 2400 according to an embodiment of the disclosure is in the "reduced display 410 state", at least some antennas disposed on the first side member 450 may be implemented as an antenna in the form of a planner inverted F antenna (PIFA), and when the electronic device 2400 is in the "expanded display 410 state", the antennas may be implemented as a loop-shaped antenna 2701 so that the same antenna characteristics can be assured.

As described above, various embodiments of the disclosure are able to provide an electronic device capable of maintaining the characteristics of an antenna constant even if the size or shape of a housing is changed by disposing an external segment on at least a portion of a sliding cover facing an inner segment disposed on a surface of a side member.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
a housing comprising a first side member forming a first periphery of the housing and a second side member disposed opposite to the first side member and forming a second periphery of the housing, wherein the first side member comprises multiple conductive portions, and at least one first non-conductive portion disposed between the multiple conductive portions, and wherein the second side member is configured to slide from the first side member and comprises a sliding cover surface covering at least a portion of the multiple conductive portions and at least a portion of the at least one first non-conductive portion;
a flexible display, an exposed width of the flexible display being adjusted based on a movement of the second side member; and
a wireless communication circuit electrically connected to the at least one of the multiple conductive portions and configured to transmit or receive RF signals,
wherein the sliding cover surface comprises at least one second non-conductive portion, and
wherein one of the at least one second non-conductive portion is disposed on a portion facing one of the at least one first non-conductive portion when the second side member overlaps the first side member most widely, and does not face the one of the at least one first non-conductive portion when the second side member overlaps the first side member most narrowly or does not overlap the first side member.

2. The electronic device of claim 1,
wherein the multiple conductive portions comprise a first conductive portion, a second conductive portion, and a third conductive portion,
wherein the first conductive portion is disposed between the second conductive portion and the third conductive portion,
wherein the at least one first non-conductive portion comprises a third non-conductive portion disposed between the first conductive portion and the second conductive portion and a fourth non-conductive portion disposed between the first conductive portion and the third conductive portion, and
wherein the third non-conductive portion overlaps the one of the at least one second non-conductive portion while the second side member overlaps the first side member most widely.

3. The electronic device of claim 2, further comprising:
a processor electrically connected to the flexible display and the wireless communication circuit; and
a printed circuit board on which the processor and the wireless communication circuit are mounted.

4. The electronic device of claim 2, wherein the RF signals comprise first to third RF signals,
the first conductive portion is disposed to transmit or receive the first RF signal,
the second conductive portion is disposed to transmit or receive the second RF signal, and
the third conductive portion is disposed to transmit or receive the third RF signal.

5. The electronic device of claim 4,
wherein the first RF signal is a signal related to a low-frequency band, and
wherein the second RF signal and the third RF signal are signals related to a medium-frequency band or a high-frequency band.

6. The electronic device of claim 1, further comprising:
a sliding substrate disposed inside the second side member to be movable toward the first side member and disposed to support a portion of the flexible display;
a hinge shaft disposed in a length direction of the flexible display and configured to rotate based on a movement of the second side member; and
an articulated hinge comprising multiple joints surrounding the hinge shaft, the articulated hinge being configured to adjust the exposed width of the flexible display by adjusting the length of a portion facing a first direction based on the rotation of the hinge shaft.

7. The electronic device of claim 1, further comprising:
an insulating member disposed on an inner surface of the sliding cover surface facing a surface of the first side member,
wherein the insulating member is an insulating tape.

8. The electronic device of claim 1,
wherein the sliding cover surface further comprises a fourth conductive portion located adjacent to the second non-conductive portion, and
wherein the fourth conductive portion is connected to a ground of a printed circuit board of the electronic device via a hinge shaft of the electronic device, the disposed in a length direction of the flexible display and configured to rotate based on a movement of the second side member.

9. The electronic device of claim 8,
wherein the second conductive portion comprises, between the first side member and the second side member, a first protrusion, and
wherein the fourth conductive portion includes a second protrusion configured to come into contact with the first protrusion so as to form an electrical path when an overlapping portion between the second side member and the first side member is narrowest.

10. The electronic device of claim 1, further comprising:
a third side member surrounding a portion of a space between the first side member and the second side member at another side of the first side member and configured to be movable toward the another side of the first side member,
wherein the third side member comprises a same component as the second side member and is arranged to be symmetrical to the second side member.

11. The electronic device of claim 10, wherein an exposed width of the flexible display is adjusted based on a movement of the second side member or a movement of the third side member.

12. An electronic device comprising:
a housing comprising a first plate facing a first direction, a second plate facing a second direction opposite the first direction, and a space defined between the first plate and the second plate;
a first side member surrounding a portion of the space and comprising multiple conductive portions disposed on one surface thereof and at least one first non-conductive portion disposed between the multiple conductive portions;
a second side member surrounding another portion of the space at one side of the first side member and configured to be movable toward the one side of the first side member;
a flexible display exposed through the first plate, an exposed width of the flexible display being adjusted based on a movement of the second side member; and
a wireless communication circuit electrically connected to the at least one of the multiple conductive portions and configured to transmit or receive RF signals,
wherein the second side member comprises a sliding cover surface facing a surface of the first side member, and
wherein the sliding cover surface comprises:
a second non-conductive portion disposed on a portion facing the first non-conductive portion when the second side member overlaps the first side member most widely, and
a third non-conductive portion disposed on a portion facing the first non-conductive portion when the second side member overlaps the first side member most narrowly.

13. The electronic device of claim 12, further comprising:
an insulating member disposed on an inner surface of the sliding cover surface facing the surface of the first side member,
wherein the insulating member is an insulating tape.

14. The electronic device of claim 12, further comprising:
a third side member surrounding another portion of the space at another side of the first side member and configured to be movable toward the another side of the first side member,
wherein the third side member comprises a same component as the second side member and is arranged to be symmetrical to the second side member.

15. The electronic device of claim 14, wherein an exposed width of the flexible display is adjusted based on a movement of the second side member or a movement of the third side member.

16. An electronic device comprising:
- a housing comprising a first side member forming a first periphery of the housing and a second side member disposed opposite to the first side member and forming a second periphery of the housing, wherein the first side member comprises multiple conductive portions, and at least one first non-conductive portion disposed between the multiple conductive portions, and wherein the second side member is configured to slide from the first side member;
- a flexible display, an exposed width of the flexible display being adjusted based on a movement of the second side member; and
- a wireless communication circuit electrically connected to the at least one of the multiple conductive portions and configured to transmit or receive RF signals,
- wherein the second side member comprises a sliding cover surface disposed to expose the surface of the first side member and located adjacent to a boundary portion of the surface in a second direction when viewed from above the surface,
- wherein the sliding cover surface comprises at least one second non-conductive portion,
- wherein one of the at least one second non-conductive portion is disposed on a portion arranged in a straight line with one of the at least one first non-conductive portion when viewed from above the surface when the second side member overlaps the first side member most widely, and is not located adjacent to the one of the at least one first non-conductive portion when viewed from above the surface when the second side member overlaps the first side member most narrowly or does not overlap the first side member,
- wherein the multiple conductive portions comprise a first conductive portion, a second conductive portion, and a third conductive portion,
- wherein the first conductive portion is disposed between the second conductive portion and the third conductive portion,
- wherein the at least one first non-conductive portion comprises a third non-conductive portion disposed between the first conductive portion and the second conductive portion and a fourth non-conductive portion disposed between the first conductive portion and the third conductive portion, and
- wherein the third non-conductive portion is disposed in a straight line with the one of the at least one second non-conductive portion when viewed from above the surface when the second side member overlaps the first side member most widely.

17. The electronic device of claim 16, further comprising:
- a third side member surrounding a portion of a space between the first side member and the second side member at another side of the first side member and configured to be movable toward the another side of the first side member,
- wherein the third side member comprises a same component as the second side member and is arranged to be symmetrical to the second side member.

18. The electronic device of claim 17, wherein an exposed width of the flexible display is adjusted based on a movement of the second side member or a movement of the third side member.

19. The electronic device of claim 16, wherein some of the multiple conductive portions comprise a first protrusion protruding in a second direction,
- the second side member comprises a fourth conductive portion located adjacent to the second non-conductive portion and comprising a second protrusion protruding in a first direction,
- the second protrusion comes into contact with the first protrusion so as to form an electrical path when the second side member overlaps the first side member most narrowly or does not overlap the first side member, and
- the fourth conductive portion is connected to a ground of a printed circuit board.

\* \* \* \* \*